(12) United States Patent
Monedero Miranda et al.

(10) Patent No.: US 12,414,228 B2
(45) Date of Patent: Sep. 9, 2025

(54) PRINTED CIRCUIT BOARD WITH ELECTROMAGNETIC BANDGAP STRUCTURE FOR LAUNCHER IN PACKAGE DEVICES

(71) Applicant: NXP B.V., Eindhoven (NL)

(72) Inventors: Manuel Alfredo Monedero Miranda, Munich (DE); Holger Kuhnert, Munich (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/076,821

(22) Filed: Dec. 7, 2022

(65) Prior Publication Data

US 2024/0196520 A1   Jun. 13, 2024

(51) Int. Cl.
| | |
|---|---|
| *H05K 1/02* | (2006.01) |
| *H01Q 1/52* | (2006.01) |
| *H05K 3/12* | (2006.01) |
| *H01L 23/498* | (2006.01) |
| *H05K 1/18* | (2006.01) |

(52) U.S. Cl.
CPC .............. *H05K 1/0236* (2013.01); *H01Q 1/52* (2013.01); *H05K 3/12* (2013.01); *H01L 23/49827* (2013.01); *H05K 1/181* (2013.01); *H05K 2201/09072* (2013.01); *H05K 2201/10098* (2013.01); *H05K 2201/10378* (2013.01)

(58) Field of Classification Search
CPC .......... H01Q 1/22; H01Q 1/2283; H01Q 1/52; H01Q 15/008; H01K 1/00; H01K 1/02; H05K 1/0236; H05K 1/18; H05K 1/181; H05K 3/12; H05K 2201/09072; H05K 2201/10378; H05K 2201/10098; H01L 23/481; H01L 23/49827
See application file for complete search history.

(56) References Cited

U.S. PATENT DOCUMENTS

| | | | |
|---|---|---|---|
| 8,193,973 B2 | 6/2012 | Morton et al. | |
| 8,803,638 B2 | 8/2014 | Kildal | |
| 9,219,313 B2* | 12/2015 | Georgescu | H01Q 9/0457 |
| 9,887,449 B2 | 2/2018 | Qiang et al. | |
| 11,165,149 B2* | 11/2021 | Rossiter | H01P 1/2005 |
| 11,355,838 B2 | 6/2022 | Baheti et al. | |
| 2009/0039984 A1* | 2/2009 | Kim | H01P 1/2005 |
| | | | 333/212 |
| 2014/0191907 A1* | 7/2014 | Cho | H01Q 1/2283 |
| | | | 343/700 MS |
| 2017/0084971 A1 | 3/2017 | Kildal et al. | |
| 2019/0081412 A1 | 3/2019 | Hugel et al. | |

(Continued)

FOREIGN PATENT DOCUMENTS

EP    3920322 A1    8/2021

*Primary Examiner* — Thai Pham

(57) ABSTRACT

A Launcher in Package (LiP) device for wireless communications, e.g., radar communications at 77 GHz, includes a printed circuit board (PCB) arranged between a radio frequency (RF) chip package and a radiating antenna structure. The PCB include an electromagnetic bandgap (EBG) structure including a plurality of EBG elements printed in a periodic pattern on the side of the PCB facing the radiating antenna structure. The plurality of EBG elements border at least one side of an RF channel through the PCB that couples an antenna element of the radiating antenna structure with a corresponding RF launcher in the RF chip package.

20 Claims, 20 Drawing Sheets

(56) References Cited

U.S. PATENT DOCUMENTS

| | | | |
|---|---|---|---|
| 2020/0259240 A1* | 8/2020 | Moallem | H01Q 1/2283 |
| 2021/0184335 A1* | 6/2021 | Wang | H01L 24/20 |
| 2021/0384615 A1* | 12/2021 | Jia | H01Q 21/065 |

* cited by examiner

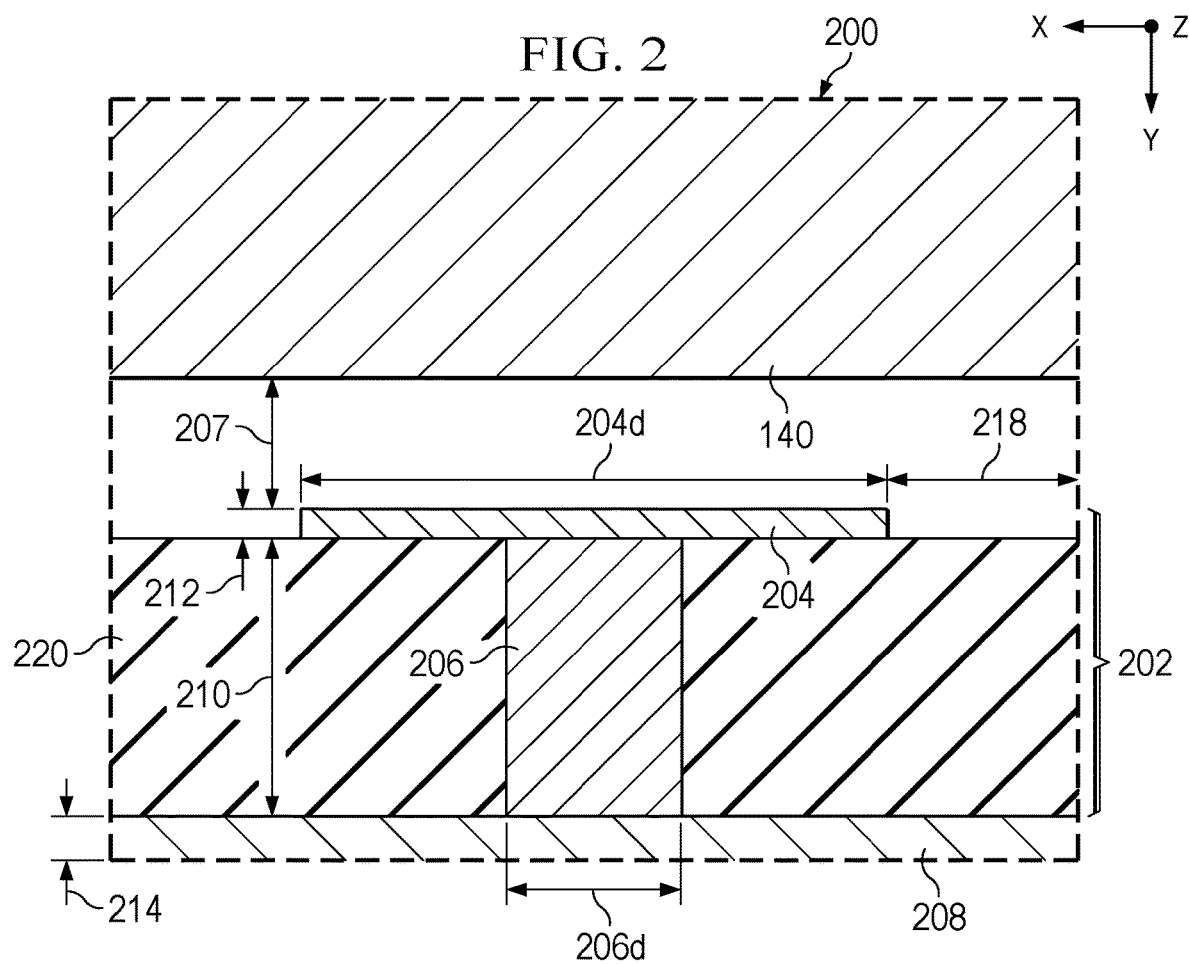

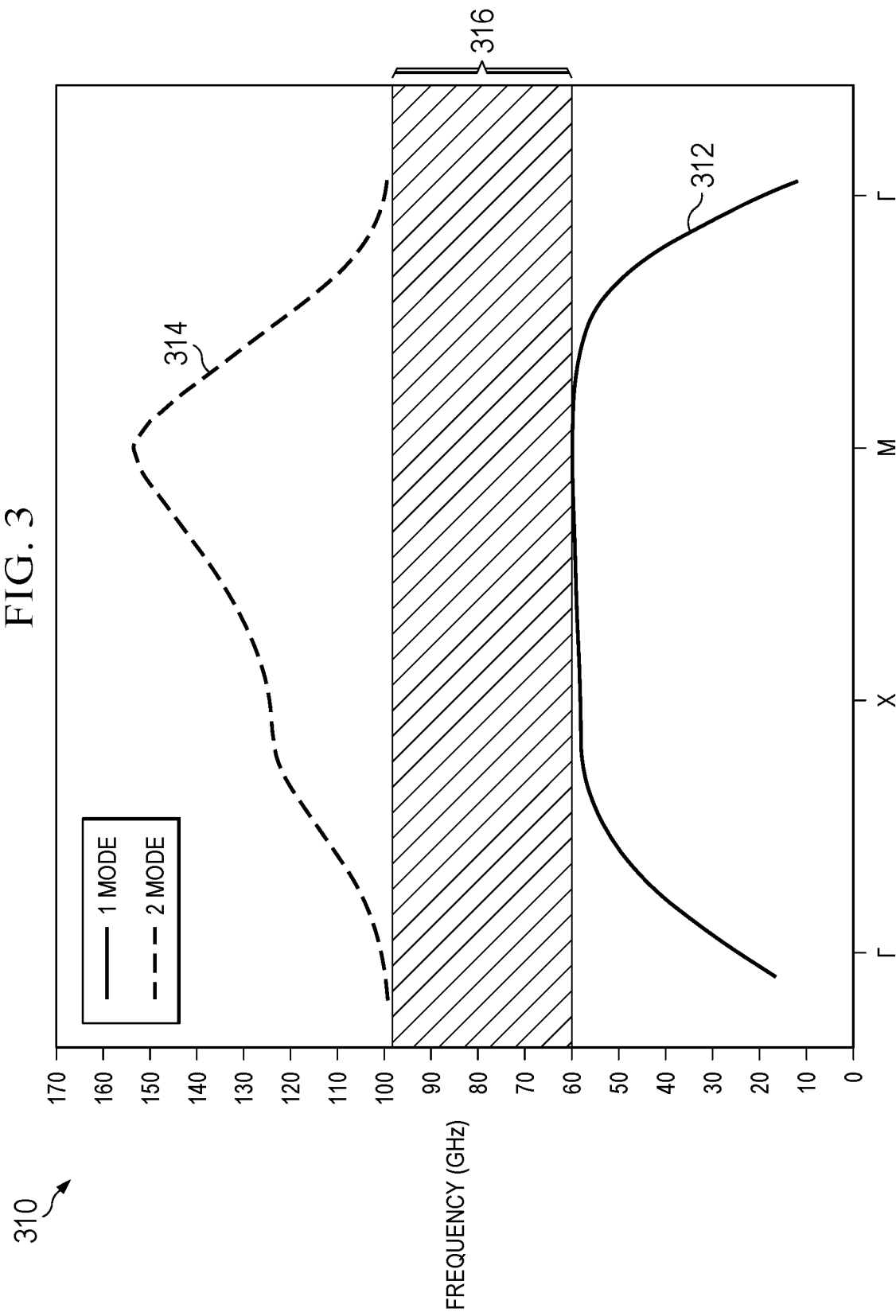

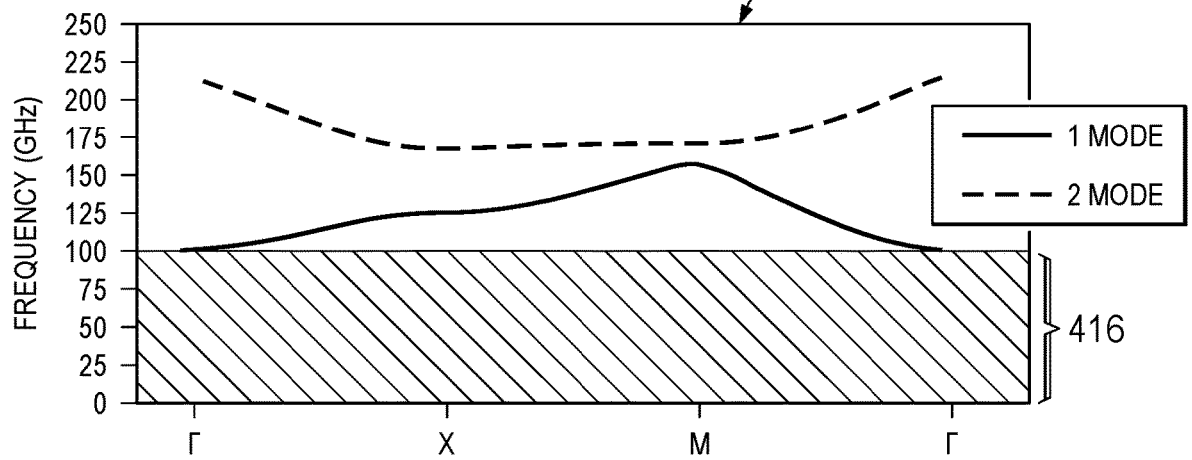
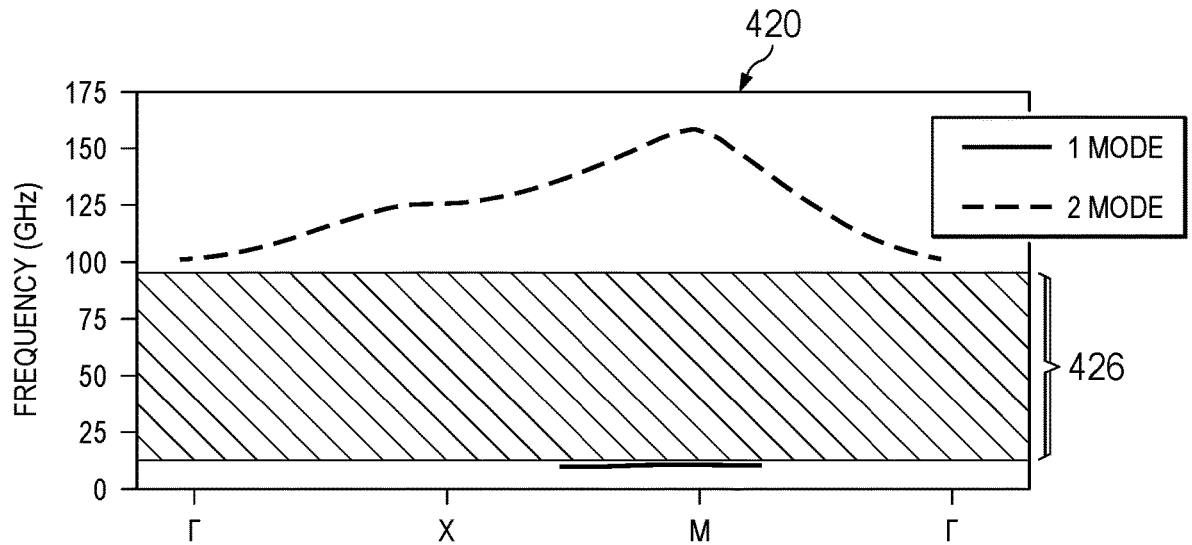

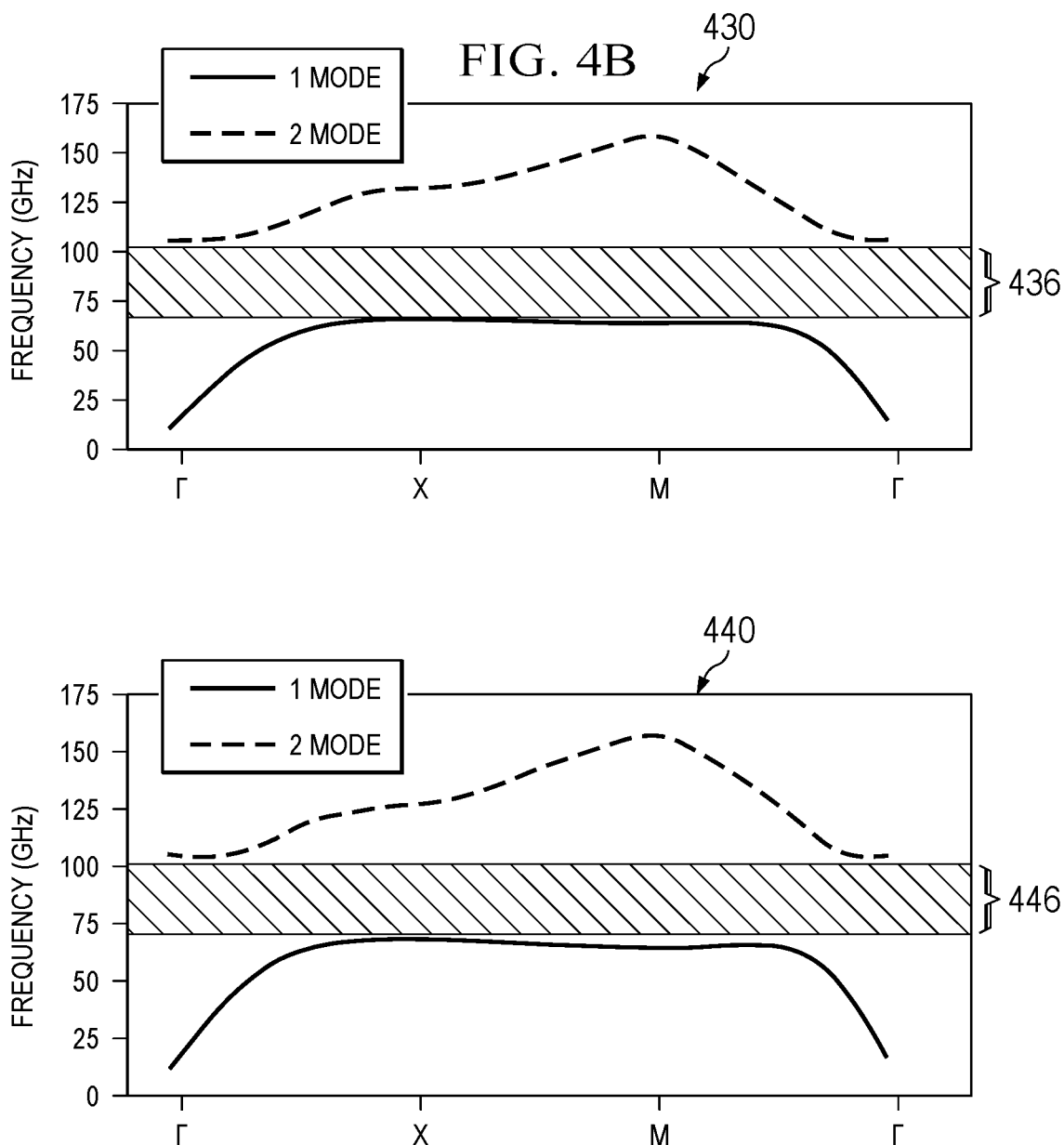

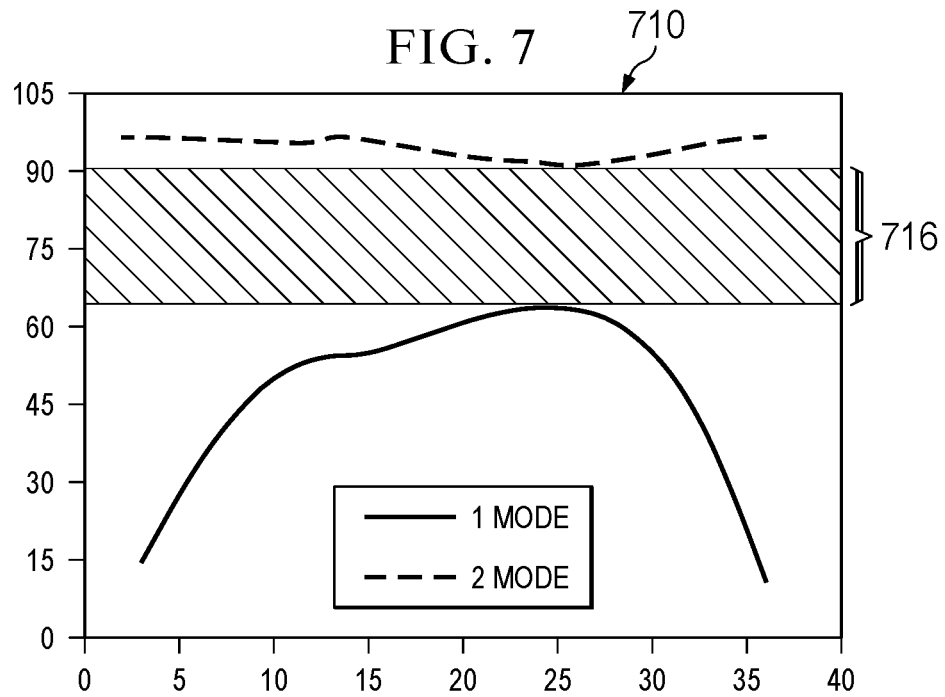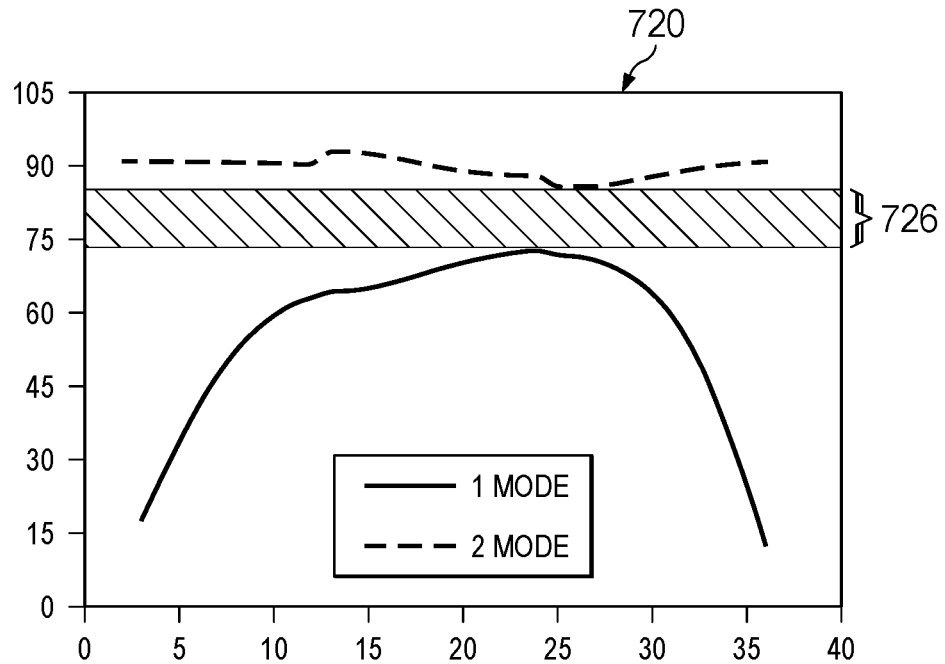

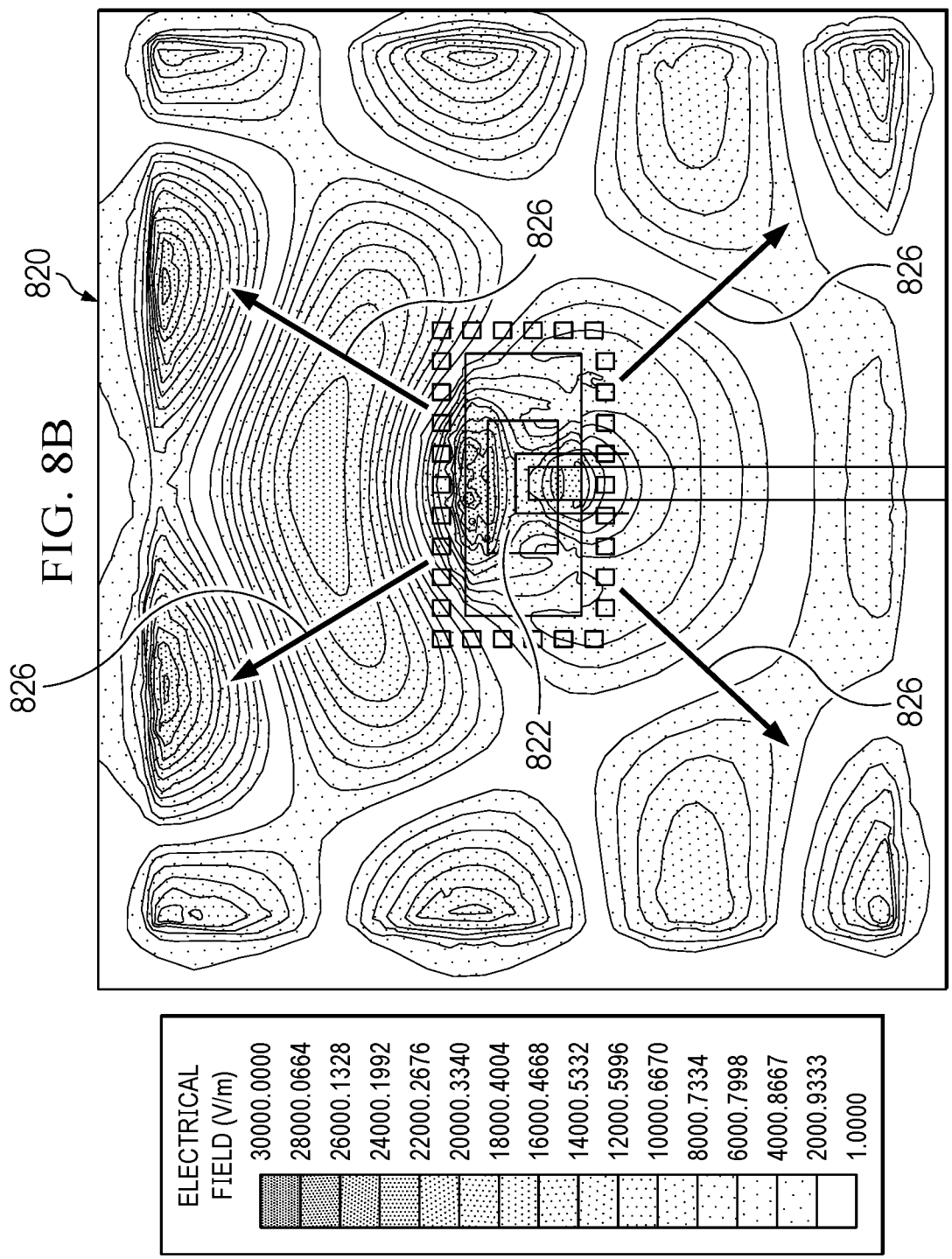

PRINTED CIRCUIT BOARD WITH ELECTROMAGNETIC BANDGAP STRUCTURE FOR LAUNCHER IN PACKAGE DEVICES

BACKGROUND

Current trends in chips for wireless communication applications, including automotive and telecommunication technologies, are moving toward Launcher in Package (LiP) devices to improve millimeter wave (mmWave) performance and to reduce the overall printed circuit board (PCB) system cost. Generally, LiP devices are produced by stacking multiple components, such as an antenna structure and a PCB, on top of one another. However, the stacking of these components typically results in the formation of gaps, e.g., between the PCB and the antenna structure. For LiP devices that are configured to communicate via multiple radio frequency (RF) paths concurrently, such as in Multiple-Input Multiple-Output (MIMO) communications, these gaps lead to cross-coupling between the internal RF channels of the LiP device which degrades the quality of the individual RF signals.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIG. 2 shows a cross-sectional view of an EBG element of the plurality of EBG elements of an EBG structure in accordance with some embodiments.

FIG. 3 shows a Brillouin dispersion diagram showing a band gap for an EBG structure printed on a PCB with a gap of 100 micrometers (μm) to an antenna array structure in accordance with some embodiments.

FIGS. 4A-4B show additional Brillouin dispersion diagrams showing band gaps for an EBG structure printed on a PCB with varying gap heights between the PCB and the antenna array structure in accordance with some embodiments.

FIG. 6A shows a cross-sectional view of one of a plurality of second EBG elements, and FIG. 6B shows a cross-sectional view of a LiP device having a second EBG structure on the antenna structure facing the first EBG structure on the PCB in accordance with some embodiments.

FIG. 7 shows two Brillouin dispersion diagrams showing band gaps for the symmetrical EBG configuration shown in FIGS. 6A and 6B with varying gap heights between the PCB and the antenna structure in accordance with some embodiments.

FIGS. 8B and 8C show two electric field illustrations demonstrating the effect of the EBG structure shown in the layout diagram of FIG. 8A. FIG. 8B shows the propagation of the electric field without the EBG structure and FIG. 8C shows the isolation of the electric field with the EBG structure in accordance with some embodiments. The electric field in FIGS. 8B to 8C corresponds to an electric field for frequency signals at 77 GHz.

DETAILED DESCRIPTION

In a LiP device that communicates via multiple RF paths, the LiP device includes an antenna structure with a plurality of antenna elements (also referred to as radiating antenna elements or antenna array elements) attached to one side of a PCB and an RF integrated circuit (IC) chip package with a plurality of RF launchers (e.g., RF transmitters and RF receivers) attached to the other side of the PCB. Each of the RF launchers is communicatively coupled to a respective antenna element of the antenna structure via through-holes, metallic-filled vias, or other types of RF conductive strips in the PCB, thus forming an internal RF channel. During the process of manufacturing the LiP device, attaching the antenna structure to the PCB generally results in the formation of a gap between the PCB and the antenna structure. This gap reduces the isolation of the internal RF channels in the LiP device and results in increased cross-coupling between these internal RF channels. FIGS. 1-12 illustrate techniques and components for reducing the cross-coupling of internal RF channels in a LiP device by arranging an electromagnetic bandgap (EBG) structure on the PCB. The EBG structure provides a barrier that prevents or reduces energy from RF signals in one internal RF channel from leaking into adjacent internal RF channels, thereby increasing the transmission and reception signal quality of the LiP device.

To illustrate by way of example, in one embodiment, the LiP device includes through-holes or metallic filled vias in the PCB that couple the RF launchers from the RF IC chip package with the corresponding transmission or reception antenna elements in the antenna structure. Each of these through-holes or metallic vias in the PCB corresponds to an internal RF channel. An EBG structure is printed on the surface of the PCB facing the antenna structure. For example, in one embodiment, the EBG structure includes a plurality of EBG elements arranged in a periodic pattern on the PCB and this plurality of EBG elements borders the through-holes or metallic vias in the PCB. The EBG structure reduces the RF energy leakage from one internal RF channel into adjacent internal RF channels, thereby decreasing the cross-coupling between the internal RF channels in the LiP device and increasing the transmission and reception signal quality. In addition, by printing the EBG structure directly on the PCB in the LiP device, the need to include an extra layer of milled EBG material is obviated.

FIGS. 1-12 illustrate embodiments of an example of an EBG structure applied on a PCB in a LiP device to reduce the cross-coupling between internal RF channels in a LiP device. However, it will be appreciated that the apparatuses and techniques of the present disclosure are not limited to implementation in this particular LiP system, but instead may be implemented in any of a variety of LiP systems using the guidelines provided herein.

Figure 1:
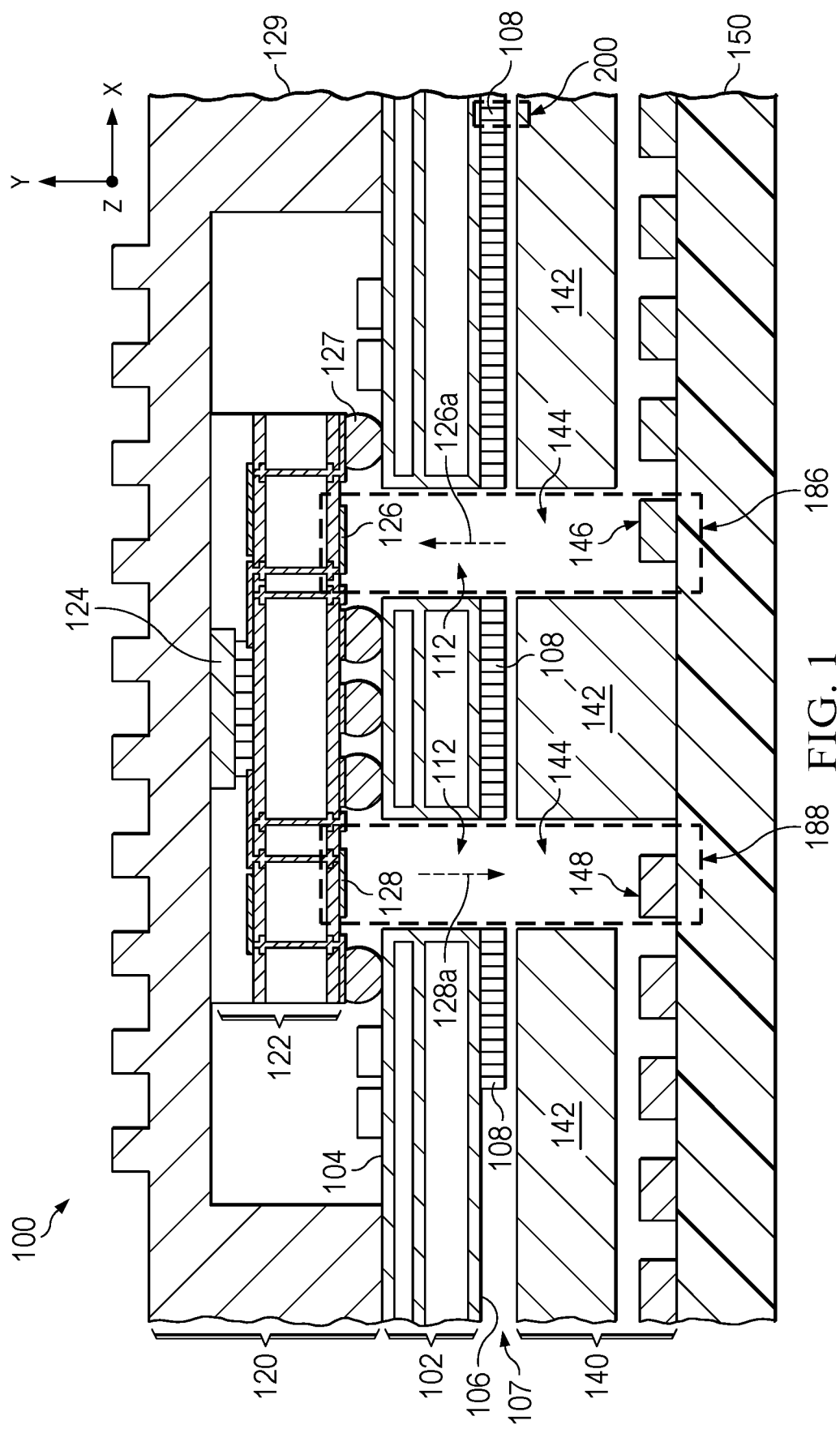
FIG. 1 shows a cross-sectional view of a Launcher in Package (LiP) device with an electromagnetic bandgap (EBG) structure on a printed circuit board (PCB) in accordance with some embodiments.

FIG. 1 illustrates a cross-sectional view of a Launcher in Package (LiP) device 100 in accordance with some embodiments. In some embodiments, the LiP device 100 includes an electronic component assembly 120, a PCB 102, an antenna array structure 140, an antenna protective enclosure 150, and an EBG structure 108, among other features. It is appreciated that in some embodiments, the LiP device 100 includes other components that may not be highlighted for purposes of conciseness and clarity of the ensuing explanation.

The electronic component assembly 120 includes an RF IC chip package 122 including an RF IC chip 124 and RF launchers 126, 128. In some embodiments, the electronic component assembly 120 includes a heat sink 129 to transfer heat generated by the RF IC chip package 122 away from the RF IC chip package 122. In some embodiments, interconnects 127 (only one instance labelled in the interest of clarity) adhere the RF IC chip package 122 to a first surface 104 of the PCB 102. For example, interconnects 127 are solder balls of a ball grid array (BGA), pins of a pin grid array (PGA), interconnects of a land grid array (LGA), solder bumps, or other type of interconnect.

The RF IC chip package 122 includes an RF IC chip 124 for conducting signal processing operations in wireless communications. For example, in one embodiment, the RF IC chip is a radar chip for controlling radar operations in the 77 gigahertz (GHz) frequency band. Thus, the RF IC chip 124 can include low-power amplifiers, high-power amplifiers, modulators, demodulators, mixers, low-pass filters, analog-to-digital (ADC) converters, digital-to-analog (DAC) converters, as well as other components for processing received RF signals or for processing signals for RF transmission. In some embodiments, the RF IC chip 124 is coupled to one or more RF launchers such as RF launchers 126, 128 through vias or interconnects in the RF IC chip package 122. The RF launchers 126, 128 are RF elements that transmit and/or receive electromagnetic signals. For example, the RF launchers 126, 128 are radiative elements that are constructed from the metal layers of a chip interconnect stack or from redistribution layers of the chip. Although two RF launchers 126, 128 are shown in FIG. 1, it is understood that this is for purposes of clarity and the number of RF launchers may be scalable to other quantities depending on the number of RF channels the LiP device 100 is designed to support. In this example, RF launcher 126 is a RF receiver to receive RF signals 126a from other devices via a reception (Rx) antenna array 146 of the antenna structure 140 and RF launcher 128 is a RF transmitter to transmit RF signals 128a from the LiP device 100 to other devices via a transmission (Tx) antenna array 148 of the antenna structure 140. In some embodiments, the RF launchers 126, 128 are arranged parallel to one another. In other embodiments, the RF launchers 126, 128 are arranged orthogonal to one another.

The PCB 102, in some embodiments, is a flat laminate composite made from non-conducting substrate materials with layers of conductive materials, such as copper circuitry, located internally or in the external surfaces. The laminate layers, for example, include a flame retardant epoxy resin and glass fabric composite such as an FR4 material. The PCB 102 includes a first surface 104 facing the RF IC chip package 122. For example, as shown in FIG. 1, the RF IC chip package 122 is attached to the first surface 104 of the PCB 102 with interconnects 127 made of any suitable solder material or alloy such as Tin, Silver, Copper, Aluminum, Nickel, Gallium, Germanium, Zinc, Silver, Gold, Bismuth, Indium, or any combination thereof. As shown, the attaching of the RF IC chip package 122 with the first surface 104 of the PCB 102 via the interconnects 127 results in a gap between the RF IC chip package 122 and the PCB 102. This gap, for example, is in the range of 10-50 micrometers (μm).

In some embodiments, the PCB 102 includes vias 112. In some embodiments, the vias 112 are air-filled through-holes that are drilled or milled into the PCB 102 and serve as an RF channel to propagate RF signals between the RF launchers 126, 128 and the corresponding antenna arrays in the antenna array structure 140. For example, the left via 112 in the PCB 102 couples the RF launcher 128 serving as a RF transmitter with the Tx array 148 of the antenna structure 140. In some embodiments, the vias 112 are metallic filled. For example, in the case of a substrate-integrated waveguide (SIW), the vias 112 are filled with a metallic material to form metallic vias.

A second surface 106 of the PCB 102 faces the antenna structure 140. The antenna structure 140, in some embodiments, is a gap waveguide slot antenna with vias 144 in the antenna structure base layer 142 that are aligned with the vias 112 of the PCB 102. To support multiple RF signals at the same time, e.g., to transmit and receive RF signals simultaneously, the antenna array structure 140, in some embodiments, includes a plurality of antenna arrays 146, 148. In this example, for purposes of consistency with the RF launchers 126, 128 in the RF IC chip package 122, two antenna arrays are shown, but it is appreciated that the number of antenna arrays is scalable with the number of RF launchers in the RF IC chip package 122. Furthermore, in the example shown in FIG. 1, antenna array 146 is a Rx antenna array to receive RF signals from other devices and forward them as RF signal 126a to the RF launcher receiver 126, and antenna array 148 is a Tx antenna array to receive RF signal 128a from the RF launcher transmitter 128 and propagate this signal to other devices, i.e., external to LiP. In some embodiments, the antenna structure 140 is covered by an antenna protective enclosure 150. For example, the antenna protective enclosure 150 is a weatherproof enclosure that protects the antenna structure 140 from external elements. For example, the antenna protective enclosure 150 is a radome that is made of a thermoplastic material (e.g., a polyurethane- or polycarbonate-based material) that minimally attenuates the RF signal transmitted or received by the antenna structure 140 while protecting the antenna structure 140 from environmental factors such as humidity.

As shown in FIG. 1, the LiP device 100 includes multiple internal RF channels 186, 188. A first internal RF channel 186 includes RF launcher 126 and antenna array 146 as well as the corresponding via 112 in the PCB 102 and via 144 in the antenna array structure 140 that couples them. A second internal RF channel 188 includes RF launcher 128 and antenna array 148 as well as the corresponding via 112 in the PCB 102 and via 144 in the antenna array structure 140 that couples them.

In some embodiments, the process of stacking the PCB 102 and the antenna array structure 140 together (e.g., by screwing or soldering with soldering balls) results in the formation of a gap 107. The gap 107, for example, may be in the range of 100 µm to 300 µm and can lead to cross-coupling between the internal RF channels 186, 188 of the LiP 100. For example, the energy from RF signal 128a in the internal RF channel 188 may leak into the adjacent internal RF channel 186 for RF signal 126a. This cross-coupling of internal RF channels increases the amount of interference in the RF signal 126a. In another example, if both RF launchers 126, 128 are receivers, then a first RF signal received at a first antenna array and forwarded to a first RF receiver can leak into the RF channel corresponding to the reception of a second RF signal received at a second antenna array and forwarded to a second RF receiver. In order to reduce the cross-coupling of the internal RF channels, an EBG structure 108 is applied to the PCB in the gap 107 between the PCB 102 and the antenna structure 140.

In some embodiments, the EBG structure 108 is formed by printing a plurality of EBG elements in a periodic pattern on the PCB 102. For example, in one embodiment, 3-D printing techniques are used to apply the EBG structure 108 including the plurality of EBG elements on the second surface 106 of the PCB 102. As shown on the right-hand side of FIG. 1, in some embodiments, the EBG structure 108 is printed along the entire interface between the PCB 102 and the antenna array structure 140. In other embodiments, as shown on the left-hand side of FIG. 1, the EBG structure 108 is printed along a border of the internal RF channel 188 created by the vias 112 and vias 144 of the PCB 102 and antenna array structure 140, respectively. In either case, the EBG structure 108 lowers the cross-coupling between the internal RF channels by acting as a barrier for energy leakage attributed to RF signals at specific frequencies, e.g., at 77 GHz.

In some embodiments, the geometry of the EBG elements and the periodic pattern for the EBG structure is developed utilizing a model analysis based on Brillouin dispersion diagrams. Example geometric configurations for periodic EBG structures printed on a PCB are described in the following figures.

FIG. 2 illustrates an example of a cross-sectional view 200 taken from FIG. 1 focused on an individual EBG element 202 of the plurality of EBG elements in the EBG structure 108. A section of the antenna array structure 140 and a gap 207 are also shown. In some embodiments, gap 207 corresponds, at least in part, to gap 107 in FIG. 1. In the cross-sectional view 200, the antenna array structure 140 is shown above the EBG element 202; that is, the cross-sectional view 200 is rotated 180 degrees relative to the cross-sectional view shown in FIG. 1.

In some embodiments, the EBG element 202 includes a supporting column 206 and a top portion 204 centered on top of the supporting column 202. In some embodiments, the supporting column 206 and the top portion 204 are made of the same EBG material. While the explanation herein describes the top portion 204 of the EBG element 202 as a disc for purposes of conciseness and clarity, it is appreciated that other shapes (e.g., quadrilaterals, octagons, dodecagons, or other polygons with a higher number of sides) can also be used. For example, instead of being in disc form as described herein, top portion 204 can be in the shape of an octagon. In some embodiments, the height 210 of the supporting column 206 is between 150 µm and 350 µm. In some embodiments, the diameter 206d of the supporting column 206 is between 150 µm and 500 µm. In some embodiments, the thickness 212 of the top portion 204 is between 15 µm and 75 µm. In some embodiments, the diameter 204d (or width across the widest part of the polygon in the case of another polygon shape) of the top portion 204 is between 500 µm and 900 µm. In some embodiments, a ratio of the diameter 204d of the top portion 204 to the diameter 206d of the supporting column 206 is between 1:1 and 5:1. For example, the diameter 204d of the top portion 204 is 700 µm and the diameter 206d of the supporting column 206 is 250 µm. In some embodiments, the supporting column 206 is printed on top of a metallization layer 208. For example, the metallization layer has a thickness 214 between 15 µm and 100 µm. In some embodiments, referring to the LiP device 100 in FIG. 1, the metallization layer 208 is printed on top of the second surface 106 of the PCB 102. In some embodiments, the height of the gap 207 is between 0 µm and 500 µm, e.g., between 50 µm and 250 µm.

In some embodiments, the EBG structure 108, including the metallization layer 208 and the plurality EBG elements 202, is designed utilizing a model analysis based on Brillouin dispersion diagrams. This Brillouin dispersion diagram modeling analysis is performed for different geometries for the plurality of EBG elements and different periodic patterns of the plurality of EBG elements to determine the EBG structure configuration on the PCB that provides a band gap at the desired frequency, e.g., at 77 GHz. For example, the EBG structure 108 is designed so the plurality of EBG elements (e.g., corresponding to multiple instances of EBG element 202) form a periodic pattern with regular interval spacings between them. In some embodiments, the periodic pattern is achieved by repeating the structure side by side in the two dimensions such as that shown in FIG. 8A, for example. In some embodiments, the distance between adjacent EBG elements 202 (as measured from the outer edges of respective top portions 204) ranges from 50 nm to 250 nm. In some embodiments, referring to FIG. 2, distance 218 is between 25 nm and 125 nm. For example, the distance between adjacent EGB elements 202 is 100 nm, i.e., distance 218 is 50 nm. Based on this design, the EBG structure is applied to the PCB utilizing 3-D printing methods, micro-lithography methods, or other similar printing methods. Referring to FIG. 2, in some embodiments, the antenna structure 140 is a metal, metallized plastic, or another PCB with a copper layer. In some embodiments, the gap 207 is filled with air or a dielectric material. In other embodiments, the gap 207 is a vacuum. In some embodiments, the material of the EBG element 202 and/or the material of the base layer 208 includes a metal such as copper. The copper, in some embodiments, can be plated such as with an ENIG (Electroless nickel immersion gold) or an ENEPIG (Electroless nickel electroless palladium immersion gold) plating. In some embodiments, the filling 220 adjacent to and in between the plurality of EBG elements 202 is a dielectric or PCB material.

FIG. 3 illustrates an example of a Brillouin dispersion diagram 310 corresponding to an EBG structure 108 with a plurality of EBG elements 202 printed on a PCB. The x-axis of the Brillouin dispersion diagram 310 is the wave vector of the Brillouin zone of the EBG elements in the EBG structure 108 and the y-axis represents the frequency (in GHz). Lines 312 and 314 correspond to a first mode (1 mode) and a second mode (2 mode) of a parameter sweep across the Brillouin Zone using periodic boundary conditions. The area marked by 316 represents the band gap and falls between 60 GHz and 100 GHz. As used herein, the term "band gap" indicates a range at which frequencies do not propagate through the EBG structure. In other words, the EBG structure operates as a barrier to frequencies falling in the band gap. The Brillouin dispersion diagram 310 demonstrates results corresponding to an EBG structure 108 printed on a PCB with each of the plurality of EBG elements 202 designed according to the following dimensions (with reference made to the dimensions discussed above in FIG. 2).

The gap height 207 between the EBG structure 108 and the antenna structure 140 is 100 μm. The EBG element 202 includes a supporting column 206 with a height 210 of 254 μm and a diameter 206d of 250 μm. The EBG element 202 also includes a top part 204 in the form of a disc with a diameter 204d of 700 μm and a thickness 212 of 35 μm. The thickness 214 of metallization 208 is 35 μm. As shown in Brillouin dispersion diagram 310, this EBG element design results in a band gap from 60 GHz to 100 GHz. Accordingly, for a LiP device conducting radar communications at 77 GHz, the EBG structure provides a barrier so that energy associated with signals at these frequencies do not leak into other internal RF channels of the LiP device. This in turn reduces or eliminates the cross-coupling of an internal RF channel transmitting and/or receiving signals at 77 GHz with other internal RF channels of the LiP device.

FIGS. 4A-4B illustrates a series of additional Brillouin dispersion diagrams 410, 420, 430, 440 for a EBG structure design similar to one described above in FIG. 3 with varying gap heights, i.e., corresponding to gap height 207. In Brillouin dispersion diagram 410, the gap height 207 is zero. This results in a band gap 416 between 10 GHz (the starting point of the analysis) to 100 GHz. In Brillouin dispersion diagram 420, the gap height 207 is 1 μm. This results in a band gap 426 between 10 GHz and 100 GHz. In Brillouin dispersion diagram 430, the gap height 207 is 200 μm, resulting in a band gap 436 between 65 GHz and 106 GHz. In Brillouin dispersion diagram 440, the gap height 207 is increased to 300 μm. This results in a band gap 446 between 68 GHz and 104 GHz. Accordingly, for radar communications at 77 GHz, the EBG structure with a plurality of EBG elements with the dimensions described above provides a barrier to energies at 77 GHz and serves to isolate an internal RF channel carrying signals at 77 GHz for a variety of different gap heights in a LiP device. Accordingly, cross-coupling with other internal RF channels is greatly reduced or eliminated altogether.

Figure 5A:
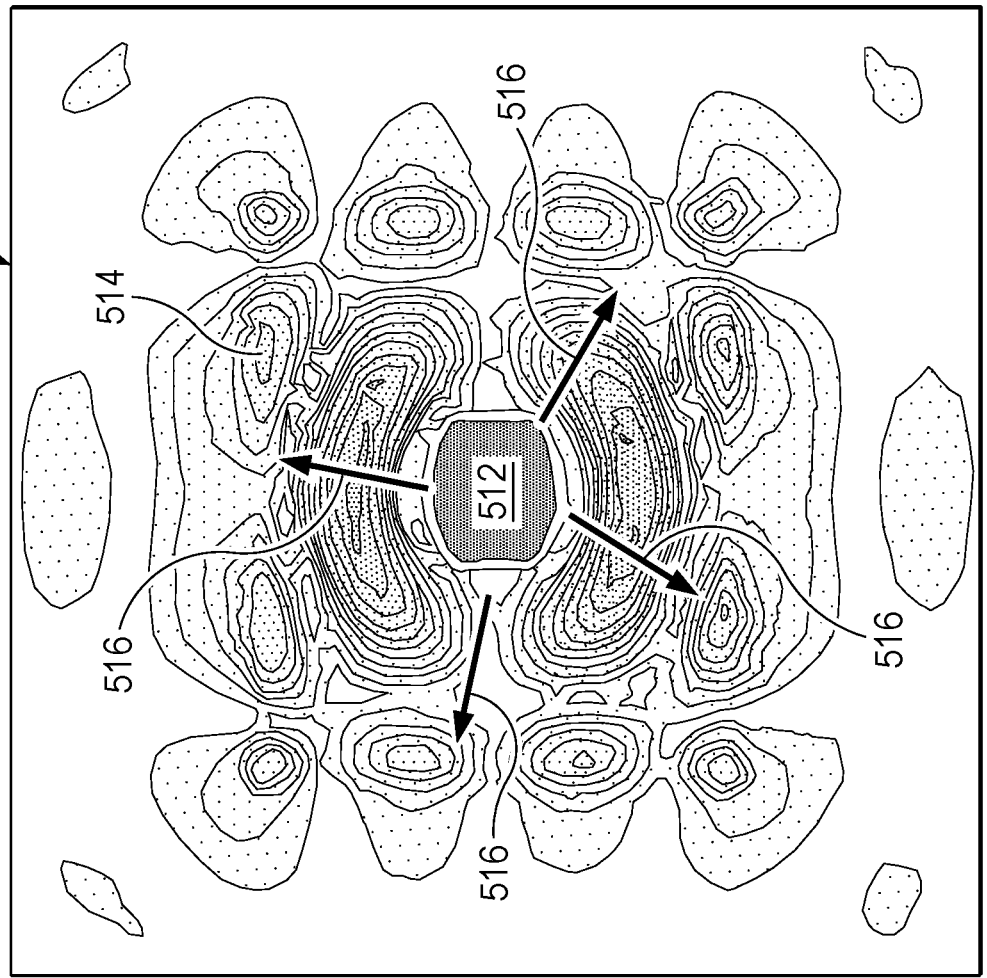
FIG. 5A shows an electric field illustration of a PCB in a LIP device without an EBG structure.
Figure 5B:
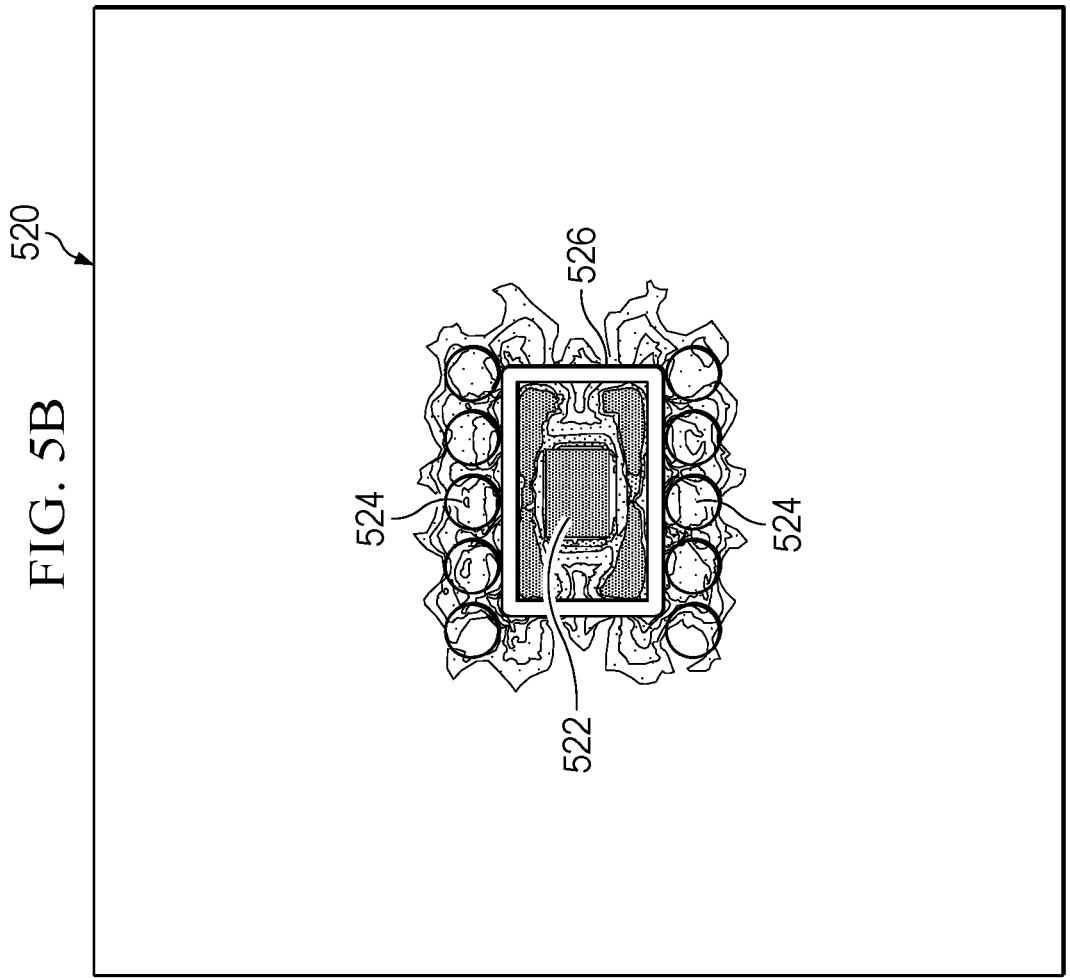
FIGS. 5B and 5C show electric field illustrations of a PCB in a LIP device with an EBG structure in accordance with some embodiments. The electric field in FIGS. 5A to 5C corresponds to the field for frequency signals at 77 gigahertz (GHz).
Figure 5C:
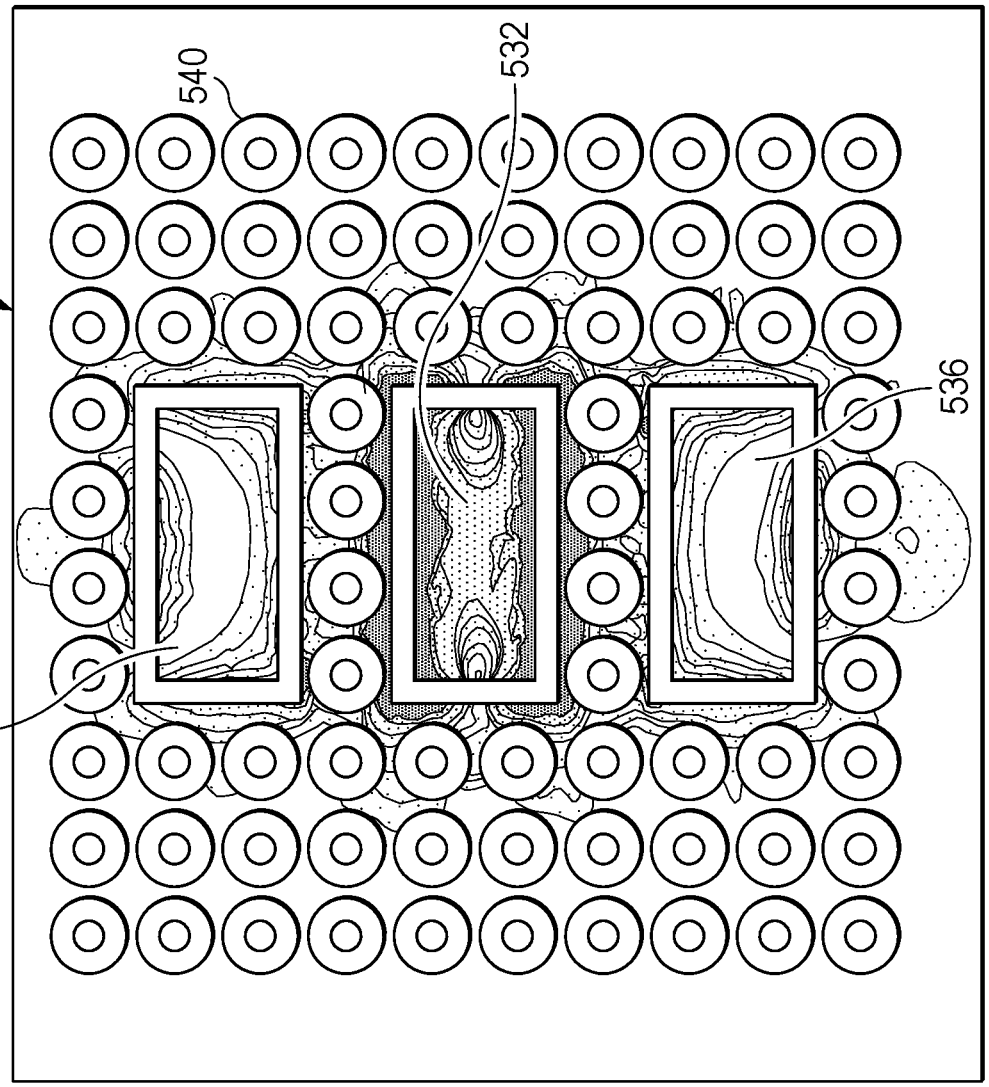

FIGS. 5A-5C shows a series of illustrations demonstrating the electric field in a PCB generated by an RF signal at 77 GHz being propagated through an internal RF channel. FIG. 5A shows the corresponding electric field in a PCB without an EBG structure, and FIGS. 5B-5C show the corresponding electric field in a PCB with an EBG structure.

In illustration 510 of FIG. 5A, the electric field in the PCB is shown for an RF signal with a frequency of 77 GHz being transmitted via an internal RF channel (e.g., via a through-hole or metallic via) in the PCB without the presence of an EBG structure. As shown, the energy from the RF signal propagates in all directions 516 away from the internal RF channel 512 (i.e., the energy leaks out over the area covered by the PCB). One example of an area with a high amount of energy leakage is shown at area 514. This energy leakage to other areas of the PCB causes cross-coupling with adjacent internal RF channels (not shown) in the PCB.

In illustration 520 of FIG. 5B, an EBG structure with a plurality of EBG elements (two instances indicated by 524) is arranged on the PCB and borders the internal RF channel 522 transmitting the RF signal at 77 GHz. As shown, the energy generated by the RF signal at 77 GHz is contained by the EBG structure 524. The barrier created by the EBG structure is shown by box 526. In this manner, the EBG structure 524 prevents leakage of the energy of the RF signal at 77 GHz from internal RF channel 522 into other internal RF channels (not shown).

In illustration 530 of FIG. 5C, the EBG structure including a plurality of EBG elements 540 (only one labelled in the interest of clarity) is depicted to illustrate the containment of the energy from the RF signal at 77 GHz to the internal RF channel 532. As shown, the two adjacent internal RF channels 534, 536 are mostly free from energy leaking into them from internal RF channel 532. In this manner, the EBG structure including the plurality of EBG elements 540 acts as a barrier to contain the energy from the RF signal at 77 GHz to the internal RF channel 532.

Figure 6A:
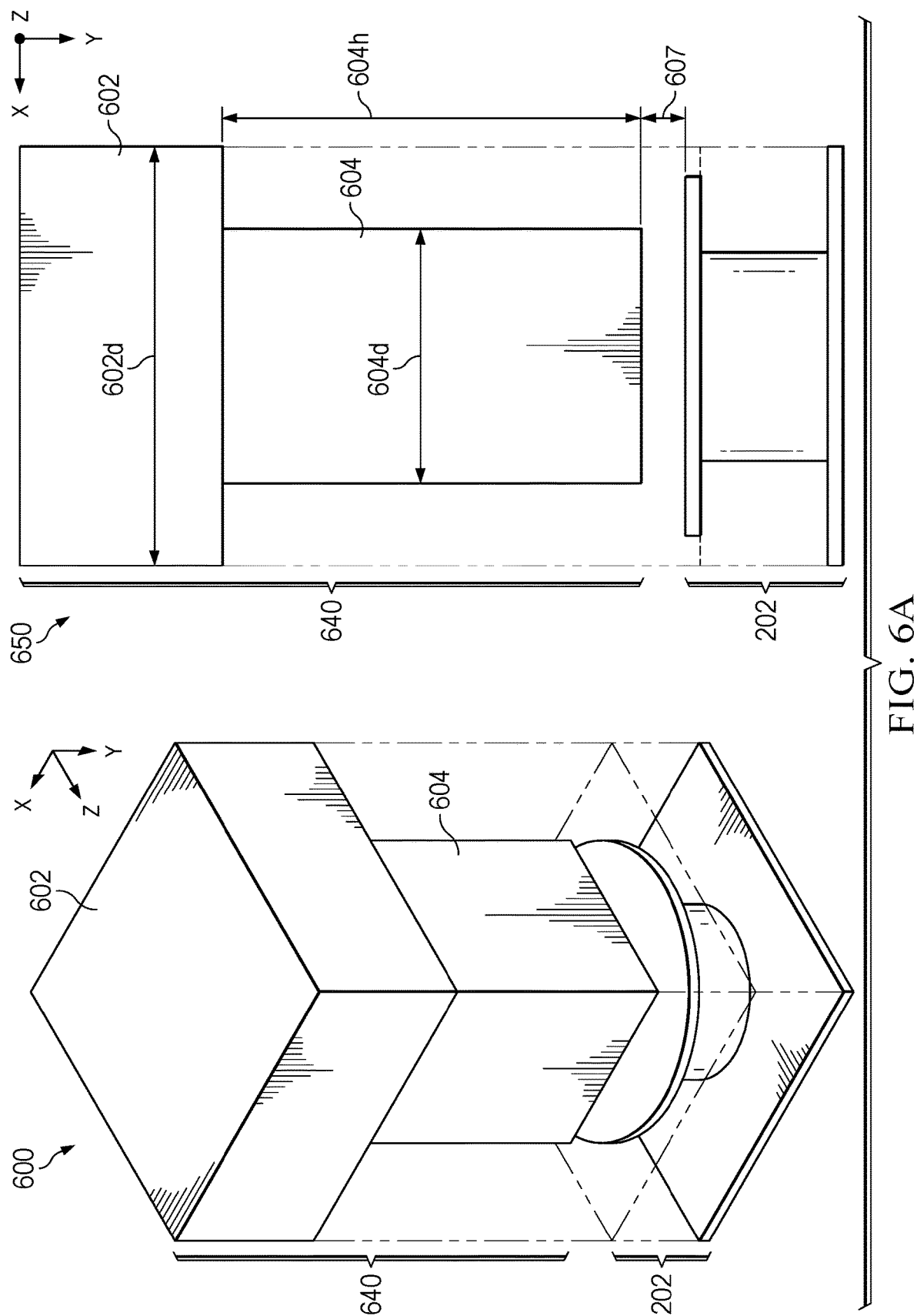
FIGS. 6A and 6B show diagrams of a symmetrical EBG configuration based on a second EBG structure.

FIG. 6A illustrates a perspective view 600 and cross-sectional view 650 of a symmetrical EBG configuration according to some embodiments. In this configuration, a second EBG structure with a plurality of EBG elements 640 (one shown) is applied to a side of the antenna structure facing the PCB. For example, referring to FIG. 1, the second EBG structure is applied to a side of antenna structure 140 in the gap 107 and facing EBG 108. In some embodiments, each of the plurality of the EBG elements 640 of the second EBG structure is aligned with an EBG element 202 of the EBG structure 108 on the PCB. In some embodiments, each of plurality of EBG elements 640 in the second EBG structure has a base portion 602 and a protrusion portion 604 extending from the base portion 702 in the direction of each of the EBG elements 202 of the EBG structure 108.

For example, each EBG element 640 in the second EBG structure includes a base portion 602 and a protrusion portion 604. The base portion 602 has a diameter 602d in the range of 500 μm to 1000 μm, and the protrusion portion 604 has a diameter 604d in the range of 250 μm to 750 μm and a height 604h in the range of 500 μm to 1000 μm. In some embodiments, the dimensions of the EBG elements 640 in the second EBG structure on the antenna side 140 are designed based on the dimensions of the EBG elements 602 in EBG structure 108 on the PCB 102. To illustrate by way of example, if each EBG element 202 in the EBG structure 108 on the PCB 102 side has a supporting column width of 400 μm, a supporting column height of 250 μm, a top portion in the shape of a disc with a diameter of 700 μm, and a disc thickness of 35 μm, each EBG element 640 in the second EBG structure on the antenna side 140 has a protrusion portion diameter 604d of 500 μm, a protrusion portion height 604h of 800 μm, and a base portion diameter 602d of 800 μm. The gap 607, for example, is 100 μm. In some embodiments, gap 607 corresponds, at least in part, to gap 107 in FIG. 1.

Figure 6B:
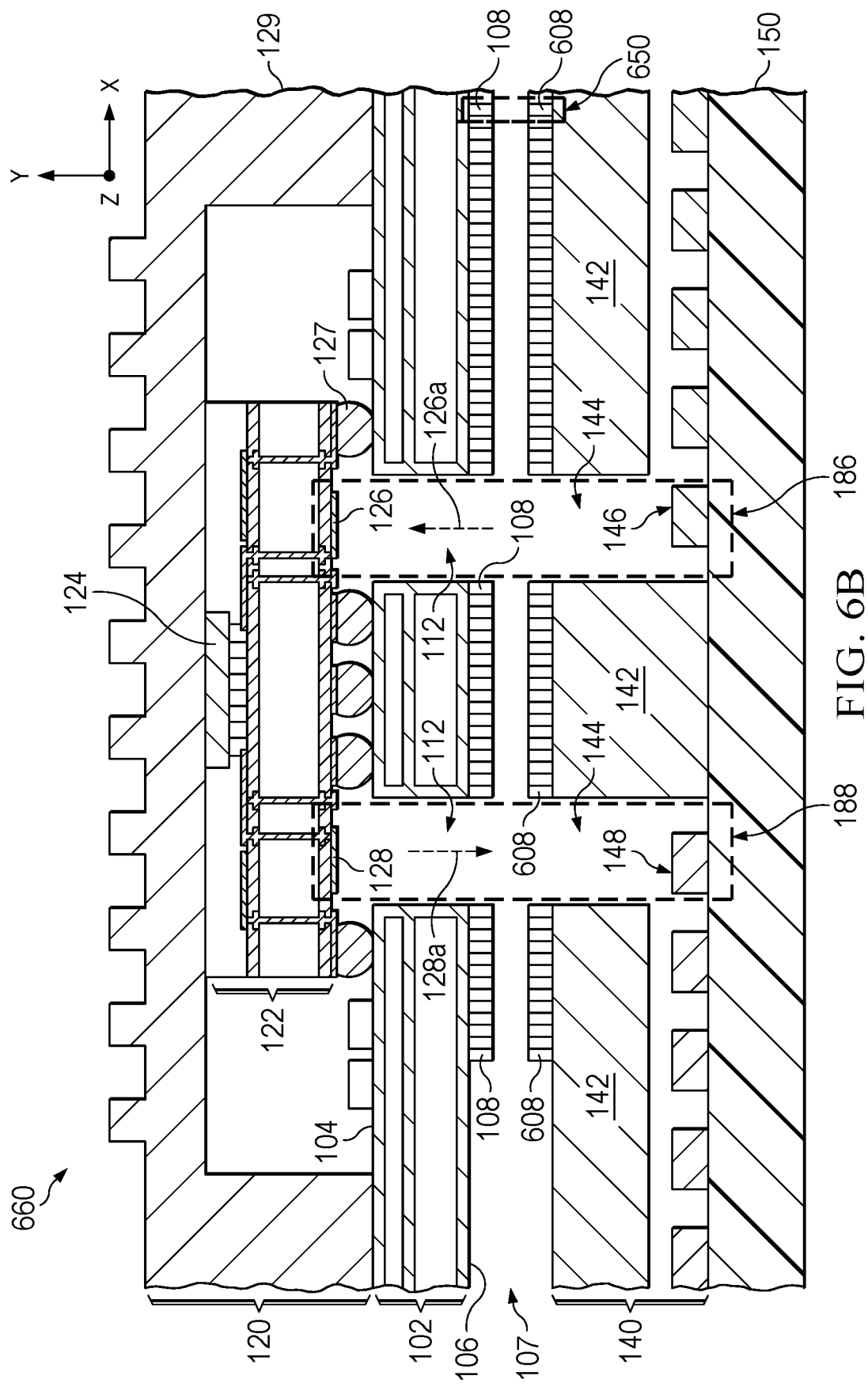

FIG. 6B illustrates a cross-sectional view of a LiP device 660 in accordance with various embodiments. In some embodiments, the LiP device 660 corresponds substantially to the LiP device 100 illustrated in FIG. 1 with a difference that a second EBG structure 608 is included on the antenna structure 140. The second EBG structure 608 includes a plurality of second EBG elements such as EBG elements 640 shown in FIG. 6A. The dashed line box 650 corresponds to diagram 650 in FIG. 6A. In some embodiments, the second EBG structure 608 is applied to the antenna structure 140 according to one of various techniques. If the antenna structure 140 is a metal, then it is subject to a milling process to produce the second EBG structure 608. If the antenna structure 140 is a metallized plastic, then the second EBG structure 608 formed in the injection mold when the antenna structure 140 is formed. In another embodiment, if the antenna structure is a PCB fanout (such as that shown in FIGS. 11 and 12), then the second EBG structure 608 is formed during the PCB manufacturing of the PCB fanout.

By implementing a symmetrical EBG configuration on both sides of the gap 607 as shown in FIG. 6A-6B, the band gap of the associated symmetrical EBG configuration can be more focused on a particular frequency. For example, FIG. 7 shows two Brillouin dispersion diagrams 710 and 720. Brillouin dispersion diagram 710 corresponds to a symmetrical EBG configuration as shown in FIG. 6A with a gap height 607 of 100 µm. Brillouin dispersion diagram 720 corresponds to a symmetrical EBG configuration as shown in FIG. 6A with a gap height 607 of 200 µm. The band gap 716 in Brillouin dispersion diagram 710 is at 65 GHz to 90 GHz. The band gap 726 in Brillouin dispersion diagram 720 is at 72 GHz to 86 GHz. Accordingly, the symmetrical EBG configuration is more frequency-selective since its corresponding band gaps cover a narrower frequency range compared to the band gaps attributed to the single EBG structure on only the PCB side (e.g., as shown in Brillouin dispersion diagram 410 for a gap height of 100 µm or by Brillouin dispersion diagram 530 for a gap height of 200 µm).

Figure 8A:
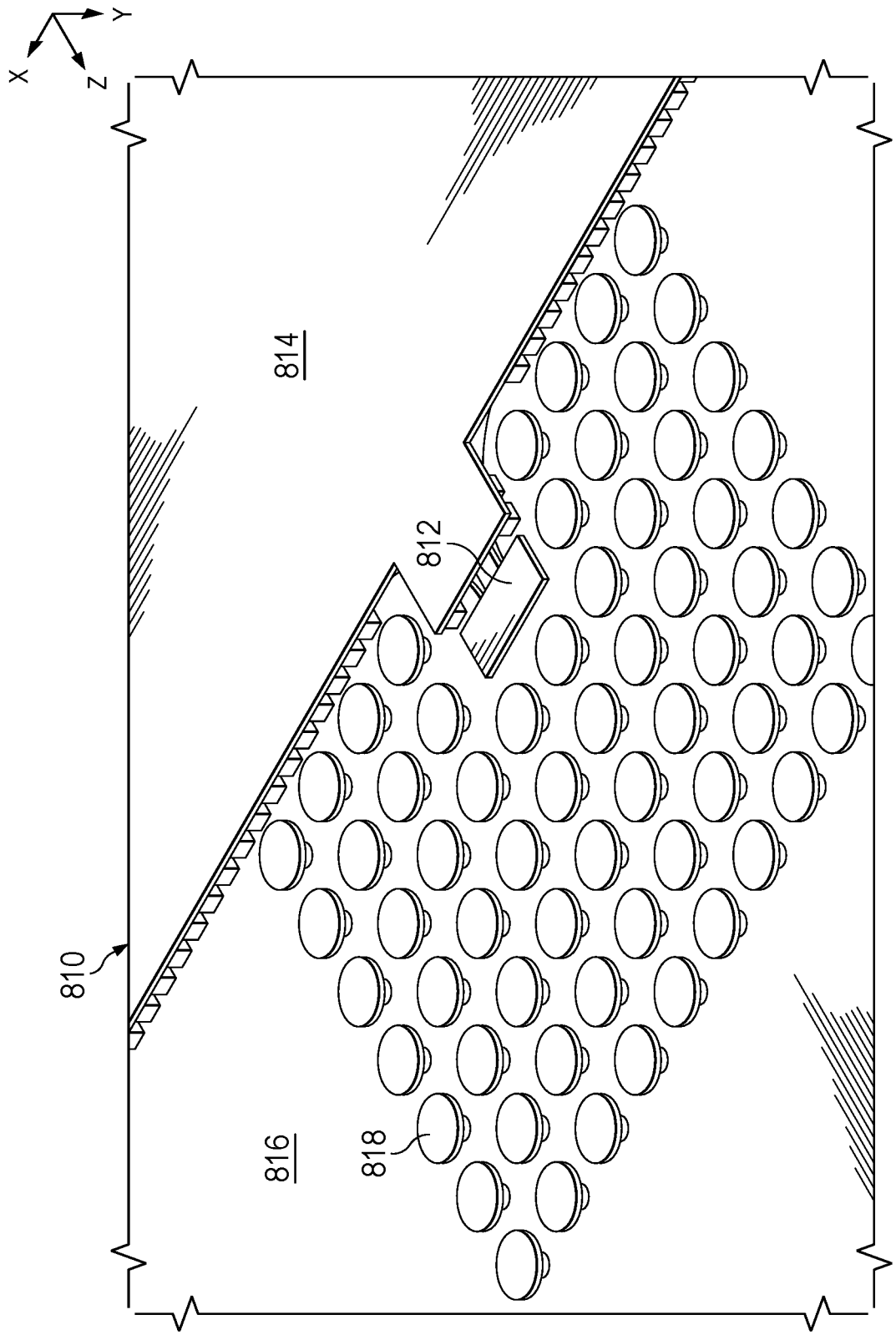
FIG. 8A shows a layout diagram of an EBG structure printed on a PCB with respect to a radiating antenna element in accordance with some embodiments.
Figure 8C:
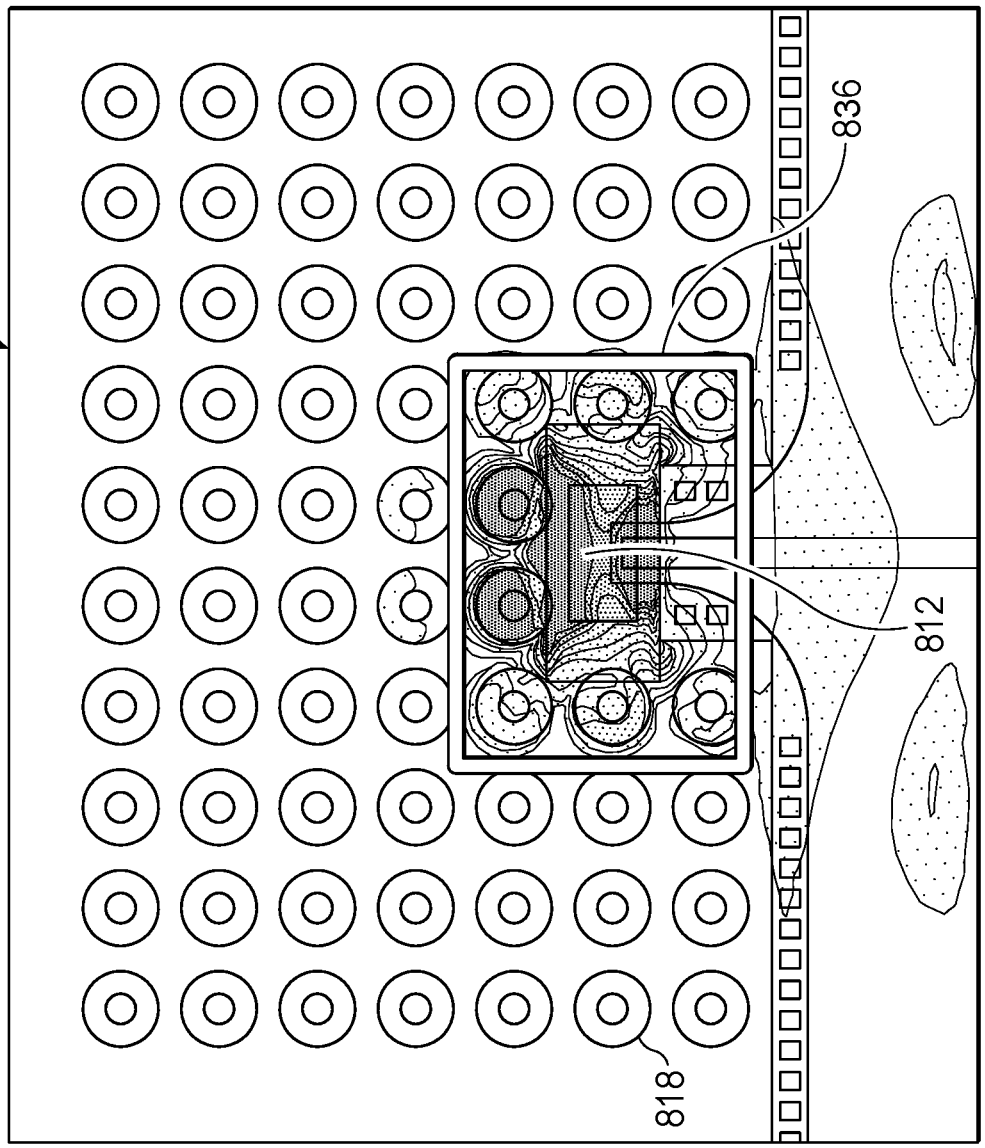

FIG. 8A shows a schematic diagram 810 of an antenna structure side perspective view of a radiating antenna element 812 of an antenna array structure 814 arranged over a PCB 816 with an EBG structure including a plurality of EBG elements 818 (only one labelled in the interest of clarity) arranged thereon. In this example, the EBG structure including the plurality of EBG elements 818 on the PCB 816 is arranged to surround the radiating antenna element 812 of an antenna array structure 814. FIG. 8B and FIG. 8C depict the electric field in the gap between the PCB 816 and the antenna structure 814 without the EBG structure (illustration 820 in FIG. 8B) and with the EBG structure (illustration 830 in FIG. 8C). The electric field corresponds to a frequency signal at 77 GHz.

In some embodiments, for schematic diagram shown in FIG. 8A, the PCB 816 corresponds to PCB 102 in FIG. 1, the antenna array structure 814 corresponds to antenna array structure 140 in FIG. 1 or 6 (or PCB fanout 1140 in FIG. 11 and PCB fanout 1240 in FIG. 12), radiating antenna element 812 corresponds to Tx antenna array 148 in FIG. 1 or 6 (or portions of PCB fanout 1140 in FIG. 11 and PCB fanout 1240 in FIG. 12), and the EBG structure with the plurality of EBG elements 818 corresponds to EBG structure 108 in FIG. 1, 6, 11, or 12, where each of the EBG elements 818 corresponds to an EBG element 202 such as the one shown in FIG. 2. From the antenna side perspective view of schematic diagram 810, the RF launcher in the RF IC package corresponding to the radiating antenna element 812 is not shown but is coupled with the radiating antenna element 812 via a corresponding internal RF channel through PCB 816 as described herein.

FIG. 8B shows an illustration of the electric field at 77 GHz in the gap between the PCB 816 and the antenna structure 814 without an EBG structure. As shown, the electric field for the radiating antenna element 822 operating at 77 GHz propagates (shown by arrows 826) throughout the entire area of the gap. This can lead to cross-coupling with other internal RF channels (not shown).

FIG. 8C shows an illustration of the electric field at 77 GHz in the gap between the PCB 816 and the antenna structure 814 with an EBG structure including a plurality of EBG elements 818 (only one labelled in the interest of clarity). As seen in illustration 830, the electric field is contained to the area 836 corresponding to the footprint of the radiating antenna element 812, i.e., the EBG structure with the plurality of EBG elements 818 creates a barrier so that the electric field of the RF signal at 77 GHz does not propagate over the entire area of the gap as shown in FIG. 8B.

Figure 9A:
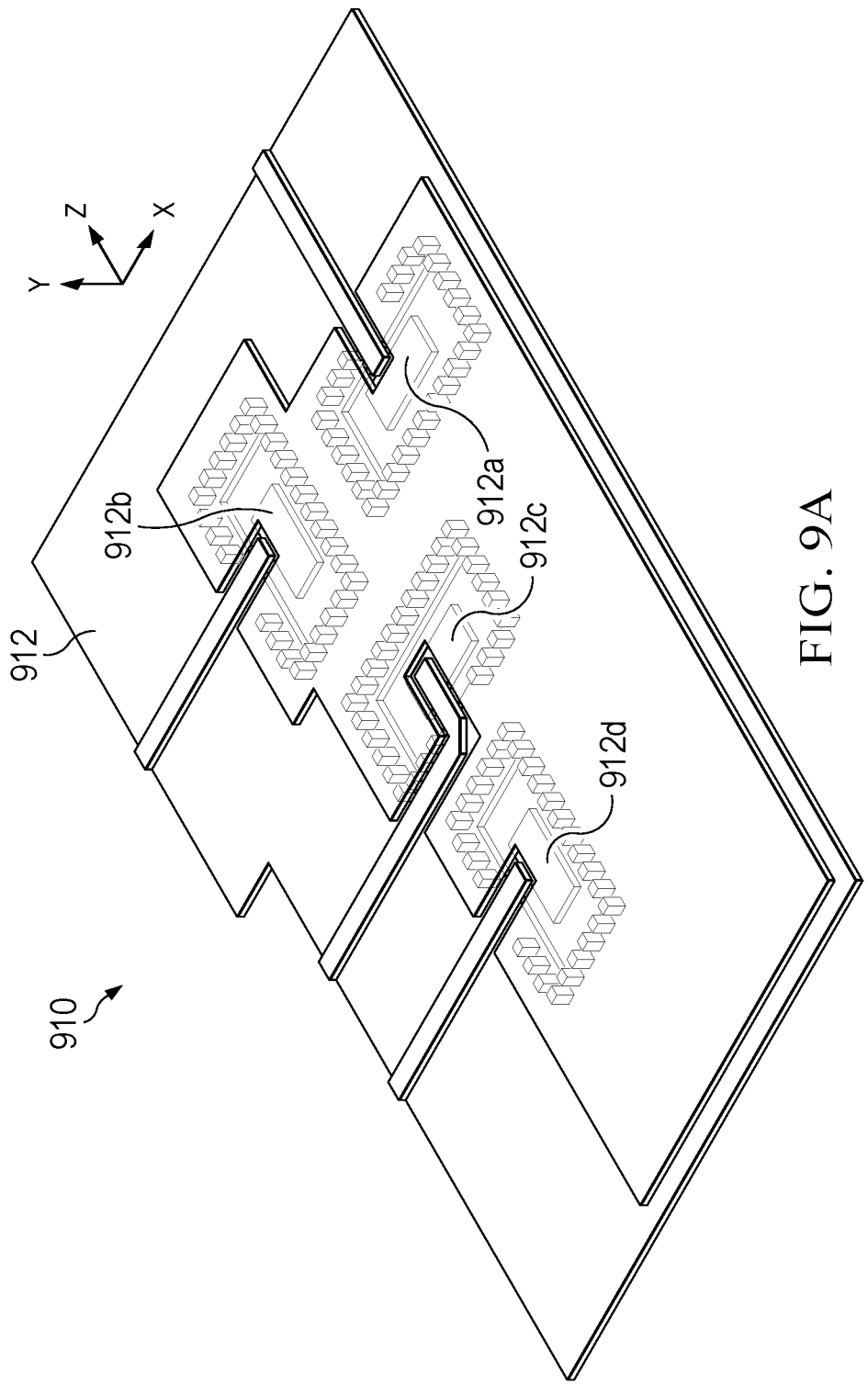
FIG. 9A shows a layout diagram of radiating antenna elements of an antenna structure without an EBG structure and FIG. 9B shows a corresponding graph illustrating the cross-coupling between RF channels associated with the radiating antenna elements of the antenna structure shown in FIG. 9A.
Figure 9B:
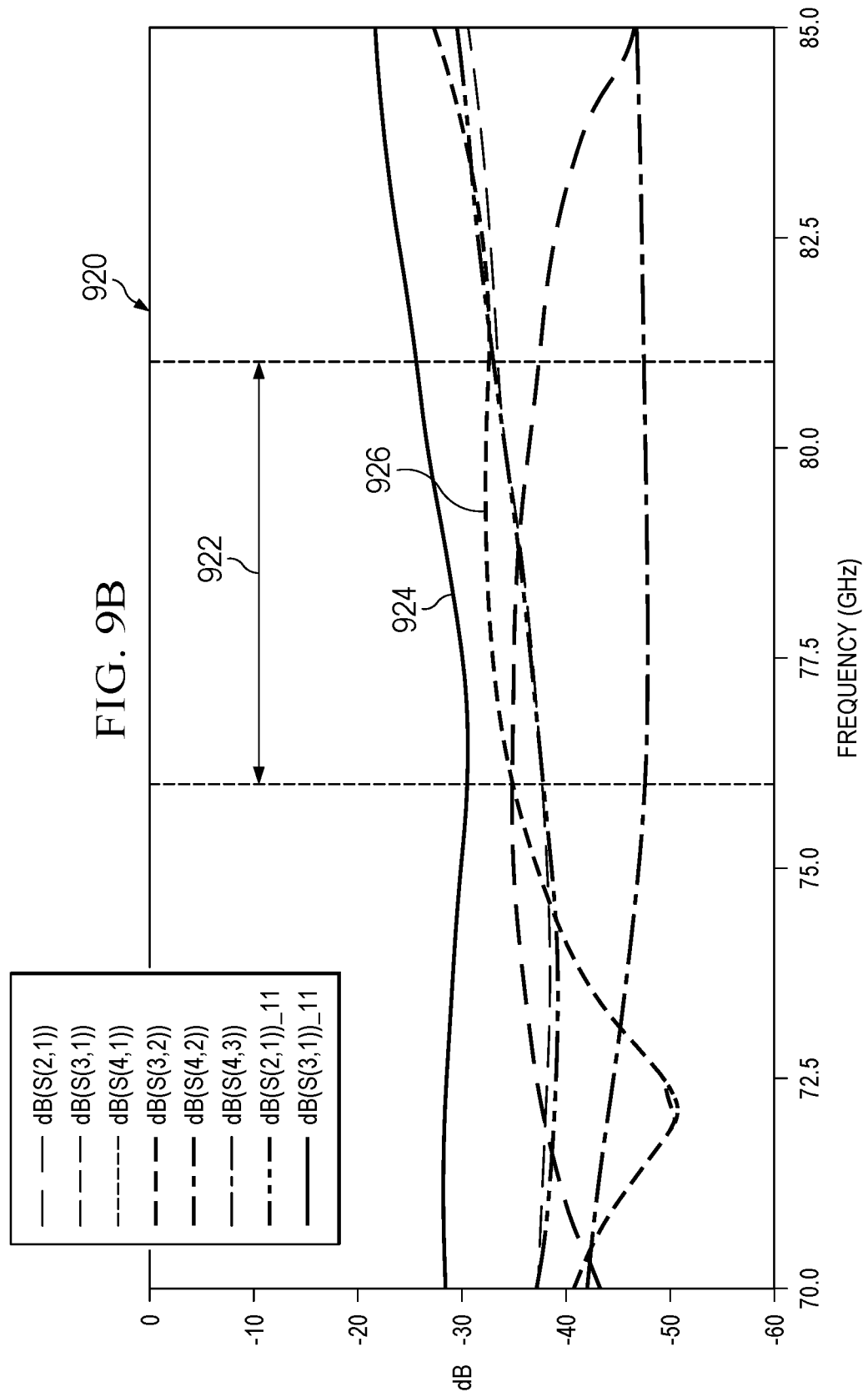
Figure 10A:
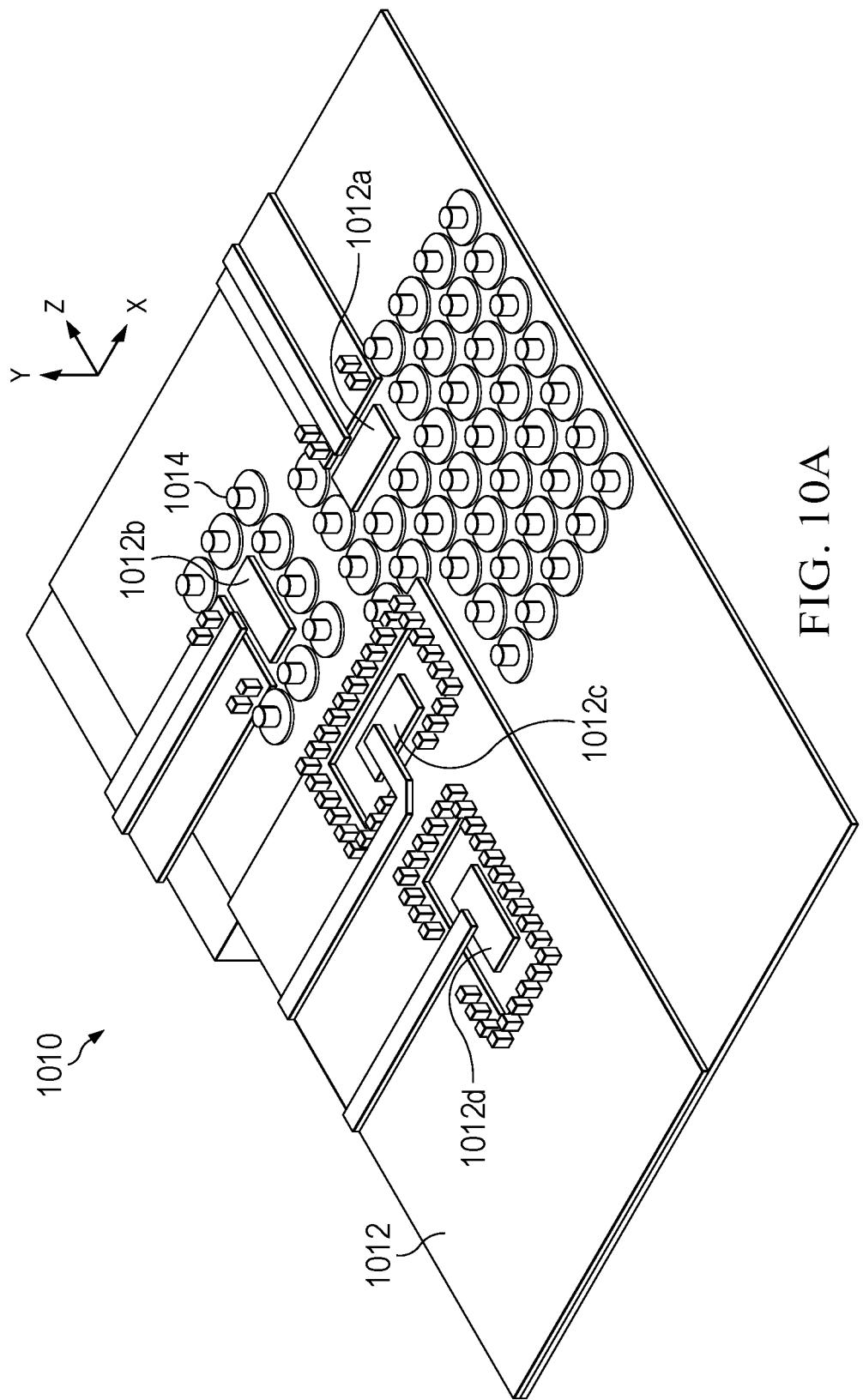
FIG. 10A shows a layout diagram of radiating antenna elements of an antenna structure with an EBG structure and FIG. 10B shows a corresponding graph illustrating the cross-coupling between RF channels associated with the radiating antenna elements of the antenna structure shown in FIG. 10A in accordance with some embodiments.
Figure 10B:
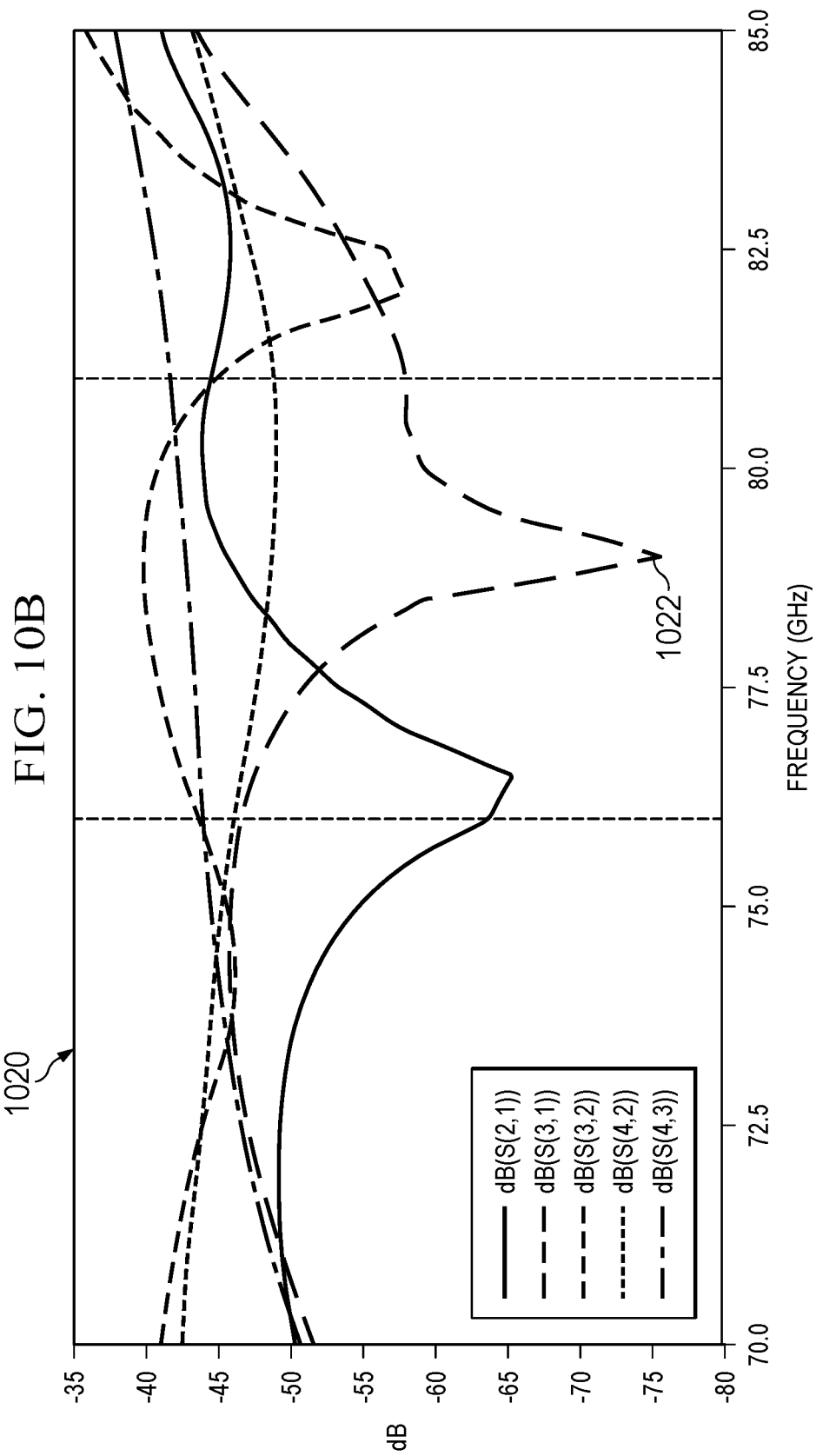

FIGS. 9A-9B and 10A-10B illustrate a comparison of the cross-coupling in internal RF channels of a LiP device without an EBG structure (FIG. 9A-9B) and a LiP device with an EBG structure (FIG. 10A-10B) according to some embodiments. FIG. 9A illustrates a layout diagram without an EBG structure 910, and FIG. 10A illustrates a layout diagram with an EBG structure 1010. Each of layout diagrams 910 and 1010 include four radiating antenna elements (912a-912d in layout diagram 910 and 1012a-1012d in layout diagram 1010), with each radiating antenna element corresponding to an internal RF channel in the LiP device. FIG. 9B shows a graph 920 corresponding to FIG. 9A, and FIG. 10B shows a graph 1020 corresponding to FIG. 10A. Both of graphs 920, 1020 illustrate the cross-coupling between the different internal RF channels corresponding to the radiating antenna elements. It is appreciated that the specific configuration of radiating antenna elements shown in layout diagrams 910, 1010 are illustrative in nature and other configurations are similarly considered. For example, while four radiating antenna elements are shown, it is appreciated that this number is scalable to other quantities depending on the number of RF channels the LiP device is designed to support.

In FIG. 9A, the layout diagram 910 shows a view of the antenna structure 912 with four radiating antenna elements 912a-912d. Each of the radiating antenna elements are coupled to an RF launcher in the RF IC chip package via a corresponding internal RF channel of the LiP device as described herein. In this example, the PCB and RF launchers on the RF IC chip package, as well as the corresponding internal RF channel linking the radiating antenna elements to the RF launchers, are not shown for purposes of illustrating the configuration of the radiating antenna elements 912a-912d.

As shown, the first radiating antenna element 912a and the third radiating antenna element 912c are parallel to one another and orthogonal to both the second radiating antenna element 912b and the fourth radiating antenna element 912d. Graph 920 in FIG. 9B shows the coupling between the internal RF channels associated with the radiating antenna elements 912a-912d. The x-axis of graph 920 is the frequency range (in GHz) and the y-axis shows the cross-coupling between the internal RF channels associated with the radiating antenna elements 912a-912d of the layout diagram 910 in dB. The lower the dB (i.e., the more negative), the lower the coupling between the channels. The graph legend in the top left of FIG. 9B details the cross-coupling behavior shown by each line in graph 920. In the graph legend, first radiating element 912a corresponds to "1", second radiating element 912b corresponds to "2", third radiating element 912c corresponds to "3", and fourth radiating element 912d corresponds to "4." For example, the last entry in the graph legend marked "db(S(3,1))_11" refers to the cross-coupling behavior between the third radiating element 912c and the first radiating element 912a and is shown by line 924 in graph 920. It is appreciated that some of the lines shown in the legend may overlap.

A frequency band 922 of approximately 5 GHz band is highlighted between approximately 76 GHz and approximately 81 GHz. As shown in graph 920, the coupling between the parallel RF radiating antenna elements (i.e., between radiating antenna elements 912a and 912c and between radiating antenna elements 912b and 912d) is higher compared with the coupling between the orthogonal radiating antenna elements. For example, the cross-coupling shown by line 924 for the internal RF channels associated with the first and third radiating antenna elements 912a and 912c, respectively, between 76 GHz and 81 GHz ranges from about −30 dB up to about −25 dB. The cross-coupling between the other internal RF channels associated with the radiating antenna elements 912a-912d is around −33 dB down to about −47.5 dB between 76 GHz and 81 GHz.

In FIG. 10A, a layout diagram 1010 is similar to the one shown in layout diagram 910 of FIG. 9A with the addition of an EBG structure with a plurality of EBG elements 1014 (one labelled in the interest of clarity). As shown, the EBG structure with the plurality of EBG elements 1014 appears inverted (with the supporting column on top of the disc) since the view of the LiP is from the top side view, i.e., the side of the RF IC chip package.

As shown, in some embodiments, the EBG structure with the plurality of EBG elements 1014 does not need to be printed across the entire PCB surface to achieve the advantages described herein (i.e., reducing the cross-coupling between RF channels). For example, as shown in layout diagram 1010, the EBG structure with the plurality of EBG elements 1014 is arranged to border the internal RF channels associated with the first radiating antenna element 1012a and the second radiating antenna element 1012b. In this manner, at least some of the plurality of EBG elements are located between parallel internal RF channels, e.g., the internal RF channels corresponding to first and third radiating antenna elements 1012a and 1012c, respectively. By adding the EBG structure with the plurality of EBG elements 1014, the coupling between the internal RF channels associated with each of the radiating antenna elements 1012a-1012d is greatly reduced. This reduction in cross-coupling is shown in graph 1020 of FIG. 10B. The graph legend in the bottom left of FIG. 10B details the cross-coupling behavior shown by each line in graph 1020. In the graph legend, first radiating element 1012a corresponds to "1", second radiating element 1012b corresponds to "2", third radiating element 1012c corresponds to "3", and fourth radiating element 1012d corresponds to "4." For example, the second entry marked "db(S(3,1))" shows the cross-coupling between the third radiating element 1012c and the first radiating element 1012a. As shown, the cross-coupling between first and third radiating antenna elements 1012a and 1012c between 76 GHz and 81 GHz drops down to below −75 dB at 79 GHz (compared to about −28 dB at a similar frequency in FIG. 10) and is shown by line 1022. The cross-coupling corresponding to the other internal RF channels associated with each of the radiating antenna elements 1012a-1012d is reduced as well. Accordingly, by implementing an EBG structure as shown and described herein, the cross-coupling between the internal RF channels of the LiP device is reduced, thereby improving the transmission and/or reception signal qualities of the LiP device.

Figure 11:
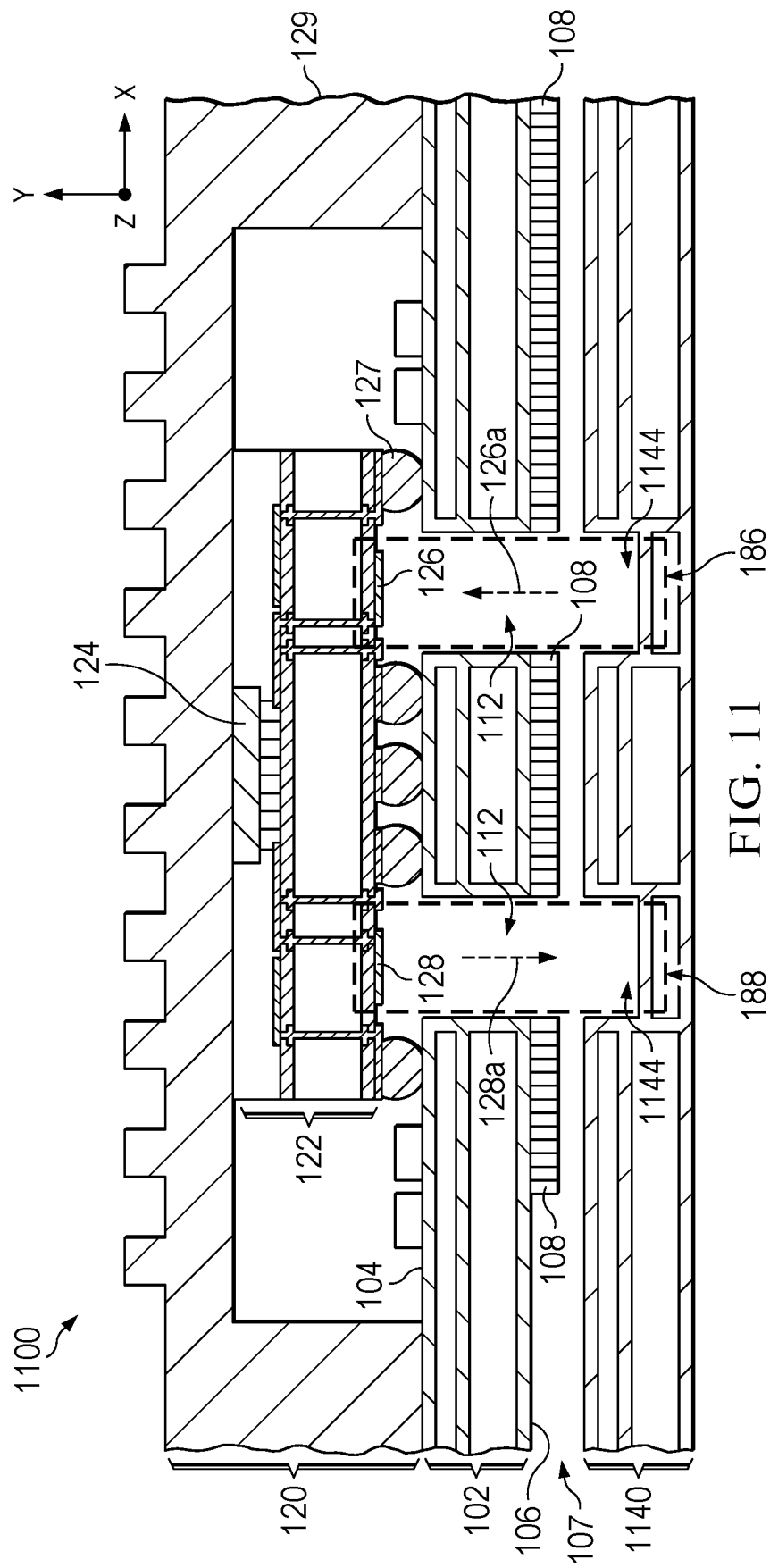
FIG. 11 shows a cross-sectional view of a LiP device with an EBG structure on a PCB facing a PCB fanout as the radiating antenna structure in accordance with some embodiments.

FIG. 11 illustrates a cross-sectional view of a LiP device 1100 in accordance with some embodiments. In some embodiments, the LiP device 1100 corresponds substantially to the LiP device 100 illustrated in FIG. 1 with a difference that the antenna structure in LiP device 1100 is a PCB fanout 1140 as opposed to an antenna array structure 140 as illustrated in FIG. 1. The PCB fanout 1140 includes vias 1144 in the PCB layer aligned with the internal RF channels 186, 188. Thus, the PCB fanout 1140 functions as an RF waveguide to propagate RF signals 126a, 128a in the internal RF channels 186, 188 to and from the RF launchers 126, 128, respectively.

Figure 12:
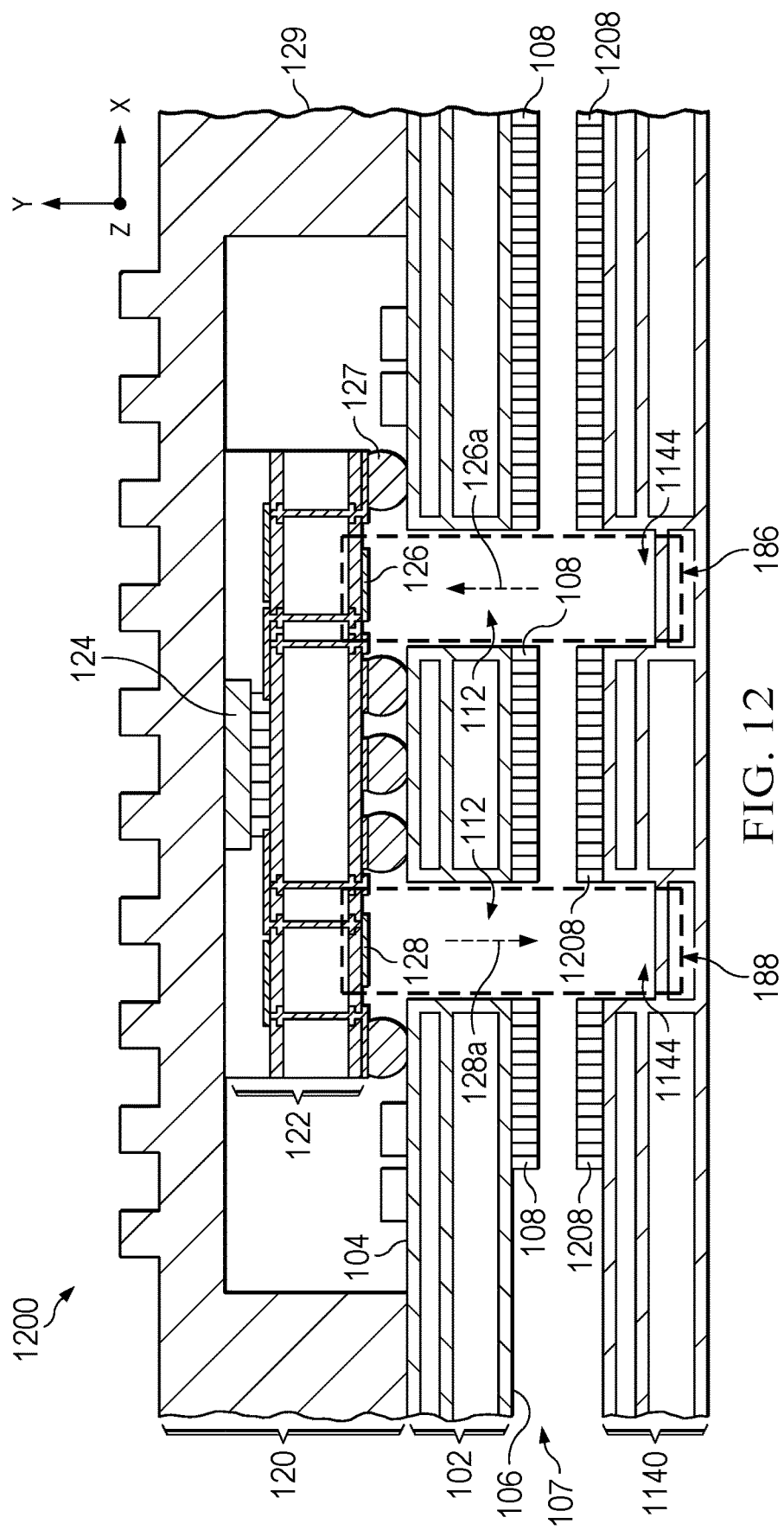
FIG. 12 shows a cross-sectional view of a LiP device with a symmetrical EBG configuration having a second EBG structure, including a plurality of second EBG elements, on a PCB fanout as the radiating antenna structure facing the first EBG structure on the PCB in accordance with some embodiments.

FIG. 12 illustrates a cross-sectional view of a LiP device 1200 in accordance with some embodiments. In some embodiments, the LiP device 1200 corresponds substantially to the LiP device 1100 illustrated in FIG. 11 with a difference that a second EBG structure 1208 is printed on the PCB fanout 1140 side. In some embodiments, the second ENG structure 1208 printed on the PCB fanout 1140 includes a plurality of second EBG elements similar to those illustrated and described in FIG. 6A, i.e., second RBG structure 1208 includes a plurality of second EBG elements similar to EBG elements 640 shown in FIG. 6A. By including a second EBG structure 1208 on the PCB fanout side, the band gap of the associated EBG configuration can be more focused on a particular frequency.

In some embodiments, since the radiating antenna structure 1140 in the LiP devices 1100 and 1200 shown in FIGS. 11 and 12 are PCB-based, they may be manufactured using similar techniques used to manufacture PCB 102. In some embodiments, this reduces the costs of production.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A printed circuit board (PCB) for a launcher in package (LiP) device, the PCB comprising:
  a first surface that faces an integrated circuit (IC) chip package of the LiP;
  a second surface that faces an antenna structure of the LiP; and an electromagnetic bandgap (EBG) structure on the second surface, the EBG structure comprising a plurality of EBG elements, wherein:
the IC chip package includes a radio frequency (RF) IC chip package with a plurality of RF launchers;
the antenna structure includes a plurality of antenna elements, each antenna element of the plurality of antenna elements corresponding to a respective RF launcher of the plurality of RF launchers;
the PCB comprises a plurality of vias, each via of the plurality of vias coupling a respective antenna element of the antenna structure with a corresponding RF launcher of the plurality of RF launchers, wherein the plurality of EBG elements borders at least one side of one via of the plurality of vias.

2. The PCB of claim 1, wherein each EBG element of the plurality of EBG elements borders one or more sides of at least one via of the one or more vias.

3. The PCB of claim 2, wherein at least a portion of one of the plurality of EBG elements is located between two vias of the plurality of vias, each of the two vias corresponding to one of two antenna elements in the antenna structure.

4. The PCB of claim 3, wherein the two antenna elements are parallel to one another.

5. The PCB of claim 1, wherein the plurality of EBG elements protrude from the second surface toward the antenna structure.

6. The PCB of claim 1, wherein the plurality of EBG elements form a periodic pattern with a regular spacing between neighboring EBG elements of the plurality of EBG elements.

7. The PCB of claim 1, wherein each of the plurality of EBG elements comprises a supporting column and a top portion on top of the supporting column.

8. The PCB of claim 7, wherein a height of the supporting column is between 150 micrometers to 350 micrometers.

9. The PCB of claim 7, wherein the top portion is a disc is centered on top of the supporting column and a diameter of the disc is greater than a diameter of the supporting column.

10. The PCB of claim 9, wherein the diameter of the supporting column is between 150 to 500 micrometers and the diameter of the disc is between 500 to 900 micrometers.

11. The PCB of claim 9, wherein the diameter of the disc is at least 1.25 times greater than the diameter of the supporting column.

12. The PCB of claim 9, wherein a thickness of the disc is between 15 to 75 micrometers.

13. A printed circuit board (PCB) for a launcher in package (LiP) device, the PCB comprising:
a first surface that faces an integrated circuit (IC) chip package of the LiP, the IC chip package including a radio frequency (RF) IC package with a plurality of RF launchers;
a second surface that faces an antenna structure of the LiP, the antenna structure includes a plurality of antenna elements, each antenna element of the plurality of antenna elements corresponding to a respective RF launcher of the plurality of RF launchers;
a plurality of vias extending between the first surface and the second surface, each via coupling one of the plurality of RF launchers to a respective one of the plurality of antenna elements;
an electromagnetic bandgap (EBG) structure on the second surface, the EBG structure comprising a plurality of EBG elements, each of the plurality of EBG elements borders at least one side of one via of the plurality of vias.

14. The PCB of claim 13, wherein at least a portion of one of the plurality of EBG elements is located between two vias of the plurality of vias, each of the two vias corresponding to one of two antenna elements in the antenna structure.

15. The PCB of claim 13, wherein the plurality of EBG elements protrude from the second surface toward the antenna structure.

16. The PCB of claim 13, wherein the plurality of EBG elements form a periodic pattern with a regular spacing between neighboring EBG elements of the plurality of EBG elements.

17. The PCB of claim 13, wherein each of the plurality of EBG elements comprises:
a supporting column; and
a top portion on the supporting column, the top portion includes a disc centered on the supporting column; and
wherein a diameter of the disc is greater than a diameter of the supporting column.

18. The PCB of claim 17, wherein a height of the supporting column is between 150 micrometers to 350 micrometers.

19. The PCB of claim 17, wherein the diameter of the disc is at least 1.25 times greater than the diameter of the supporting column.

20. The PCB of claim 17, wherein a thickness of the disc is between 15 to 75 micrometers.

* * * * *